United States Patent [19]

Hamisch, Jr.

[11] 4,111,736
[45] * Sep. 5, 1978

[54] APPARATUS FOR PRINTING AND APPLYING PRESSURE SENSITIVE LABELS

[75] Inventor: Paul H. Hamisch, Jr., Franklin, Ohio

[73] Assignee: Monarch Marking Systems, Inc., Dayton, Ohio

[*] Notice: The portion of the term of this patent subsequent to May 18, 1993, has been disclaimed.

[21] Appl. No.: 818,023

[22] Filed: Jul. 22, 1977

Related U.S. Application Data

[60] Division of Ser. No. 658,431, Feb. 17, 1976, Pat. No. 4,075,052, which is a division of Ser. No. 476,744, Jun. 5, 1974, Pat. No. 3,957,562, which is a continuation-in-part of Ser. No. 380,445, Jul. 18, 1973, abandoned, which is a continuation-in-part of Ser. No. 312,454, Dec. 6, 1972, Pat. No. 3,968,745, which is a continuation-in-part of Ser. No. 208,035, Dec. 8, 1971, abandoned.

[51] Int. Cl.$^2$ .................................... B32B 31/00
[52] U.S. Cl. ........................... 156/384; 101/288; 101/291; 101/292; 156/541; 156/542; 156/576; 156/577; 156/579; 156/584
[58] Field of Search ............... 156/384, 541, 542, 576, 156/577, 579, 584; 101/288, 292, 291

[56] References Cited

U.S. PATENT DOCUMENTS

| | | | |
|---|---|---|---|
| 2,909,301 | 10/1959 | Fritzinger | 156/576 |
| 3,213,785 | 10/1965 | Kramer | 101/69 |
| 3,265,553 | 8/1966 | Kind et al. | 156/584 |
| 3,296,962 | 1/1967 | Gupperton | 101/95 |
| 3,343,485 | 9/1967 | Loeffler | 101/288 |
| 3,420,172 | 1/1969 | Kaplan | 101/291 |
| 3,440,123 | 4/1969 | Hamisch | 156/384 |
| 3,551,251 | 12/1970 | Sato et al. | 156/384 |
| 3,611,929 | 10/1971 | Schrotz | 101/292 |
| 3,619,324 | 11/1971 | Sato et al. | 156/576 |
| 3,656,430 | 4/1972 | Olsson | 101/288 |
| 3,724,369 | 4/1973 | Gery et al. | 101/327 |
| 3,782,279 | 1/1974 | Carboni et al. | 156/384 |
| 3,800,701 | 4/1974 | Martin | 101/288 |
| 3,954,545 | 5/1976 | Hamisch et al. | 156/384 |
| 3,957,562 | 5/1976 | Hamisch | 156/384 |
| 3,960,642 | 6/1976 | Hamisch et al. | 156/384 |

*Primary Examiner*—Caleb Weston
*Attorney, Agent, or Firm*—Joseph J. Grass

[57] ABSTRACT

Disclosed are three embodiments of a hand-held apparatus for printing and applying pressure sensitive labels. All the embodiments are disclosed as having a housing, a rigid, metal, frame plate mounted by the housing, a platen and a cooperating print head, a delaminator for delaminating printed labels from the web of supporting material on which the labels are carried, an applicator for applying the printed labels, a feed wheel having teeth for engaging and advancing the web, a manually operable actuator drivingly connected to the feed wheel and the print head, a brake, and an ink roll for inking the print head. The apparatus also includes a feed wheel assembly having a feed wheel driven by a pawl and ratchet mechanism. The pawl and ratchet mechanism is adjustably connected to the feed wheel and a rolling contact type one-way clutch prevents loss of tension in the web between the brake and the feed wheel. In two of the embodiments the brake takes the form of a roll operated by the print head and in another embodiment the brake is operated by the printing head through an overcenter mechanism. The print head has a pair of ball tracks and the frame of the apparatus mounts a pair of ball tracks containing respective ball bearings. The feed wheel is driven by gear means having an eccentric adjustment. The web is guided through the apparatus by track structure which is readily assembled and removable. A delaminator of one embodiment includes a plurality of small diameter rollers mounted on a shaft. An inking mechanism includes an ink roll having hub sections, with an ink-tight seal between the hub sections. The frame plate is accurately located and reliably held to a housing section. A removable housing section is snap-locked into place relative to at least one other housing section. The labels which are carried on the web are mounted on an easy to manufacture, low cost reel. A rewinder is provided to rewind the spent portion of the supporting material web. An improved composite label web is also disclosed.

12 Claims, 37 Drawing Figures

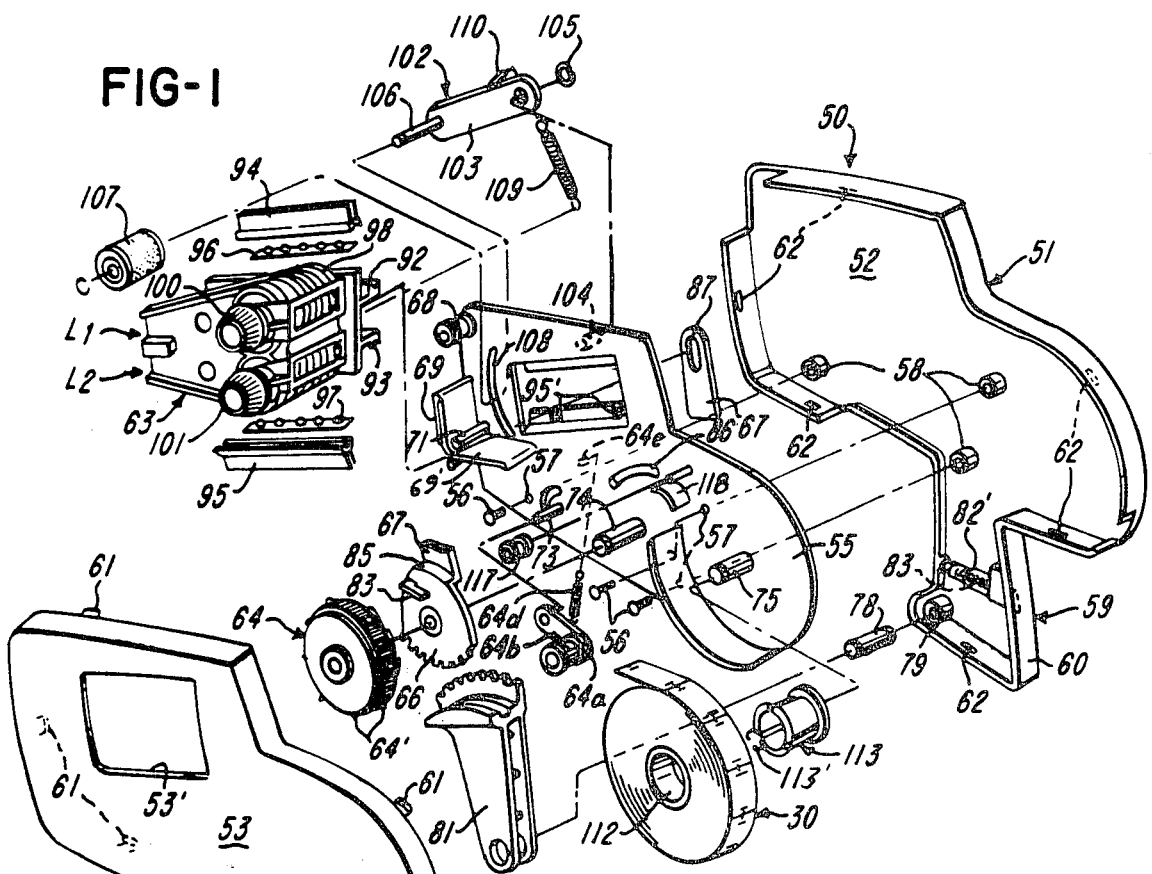

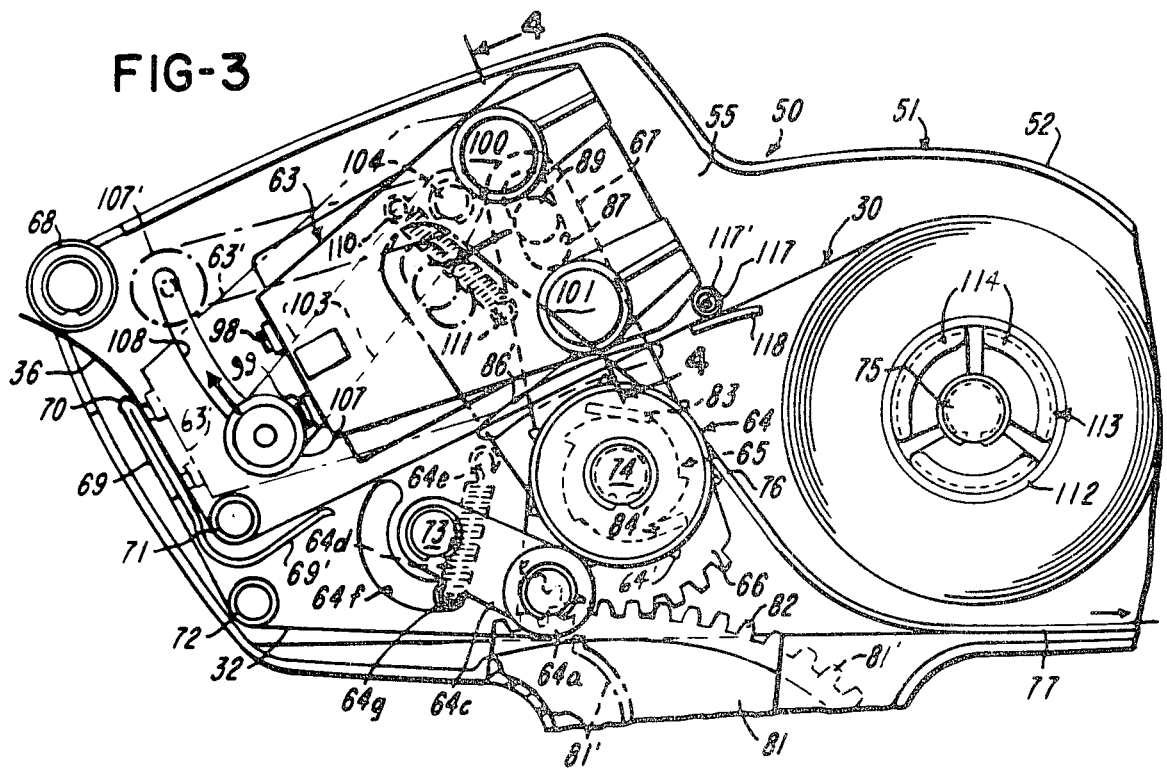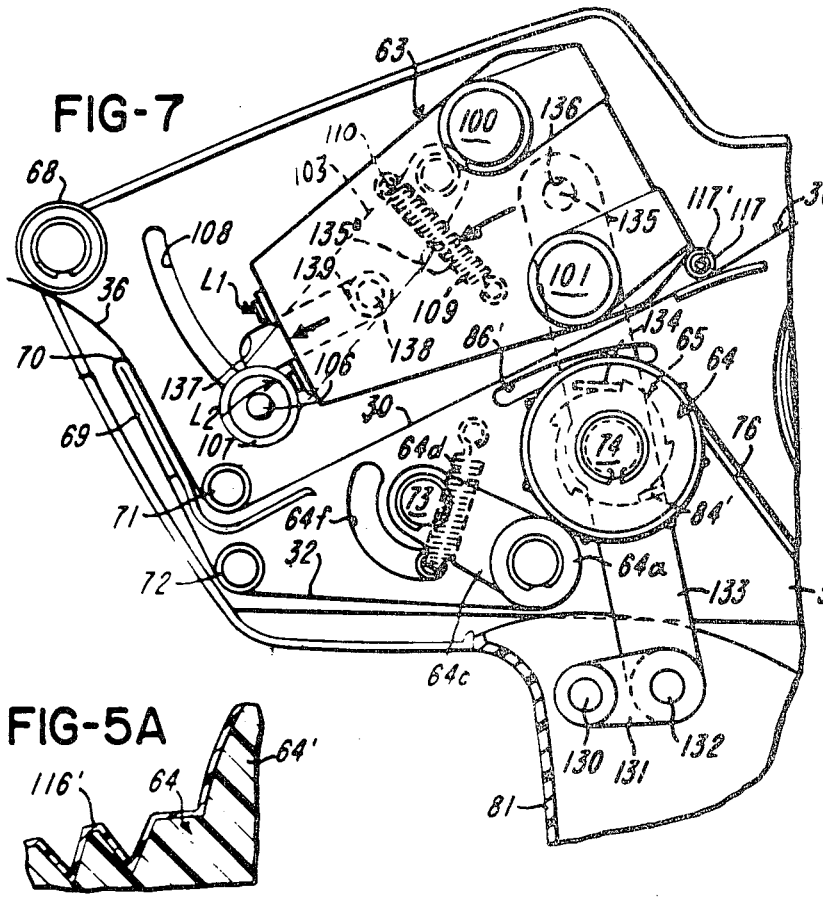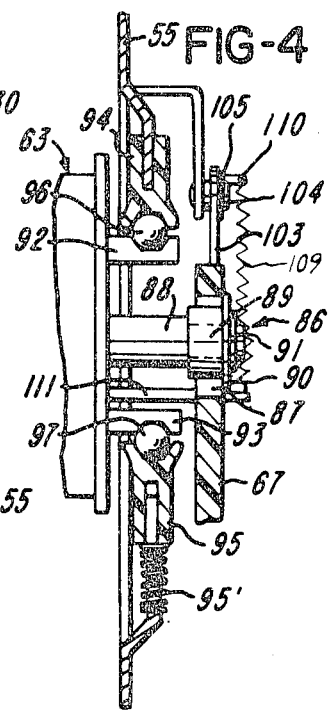

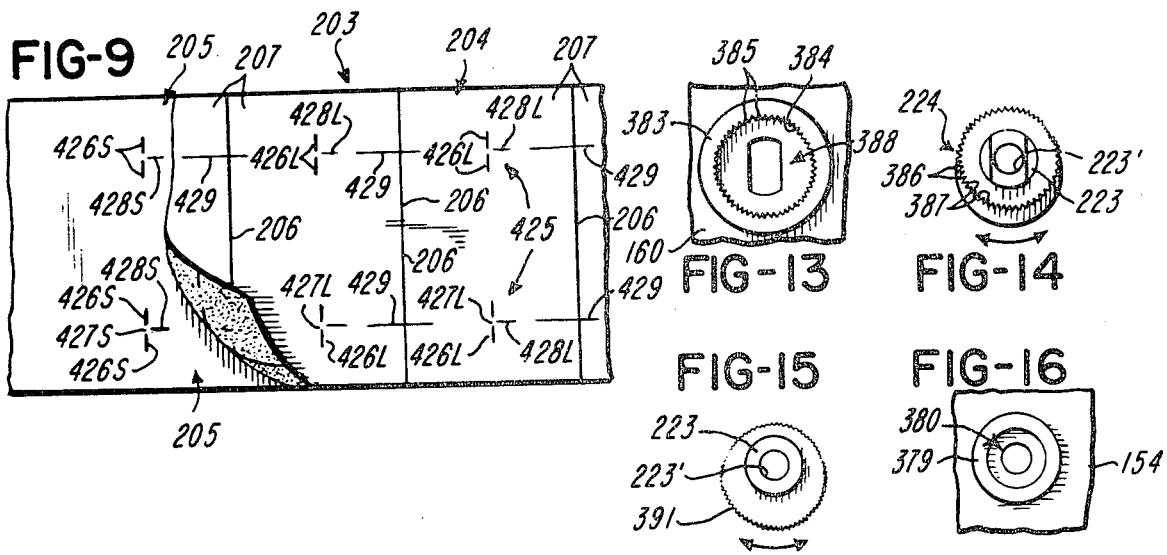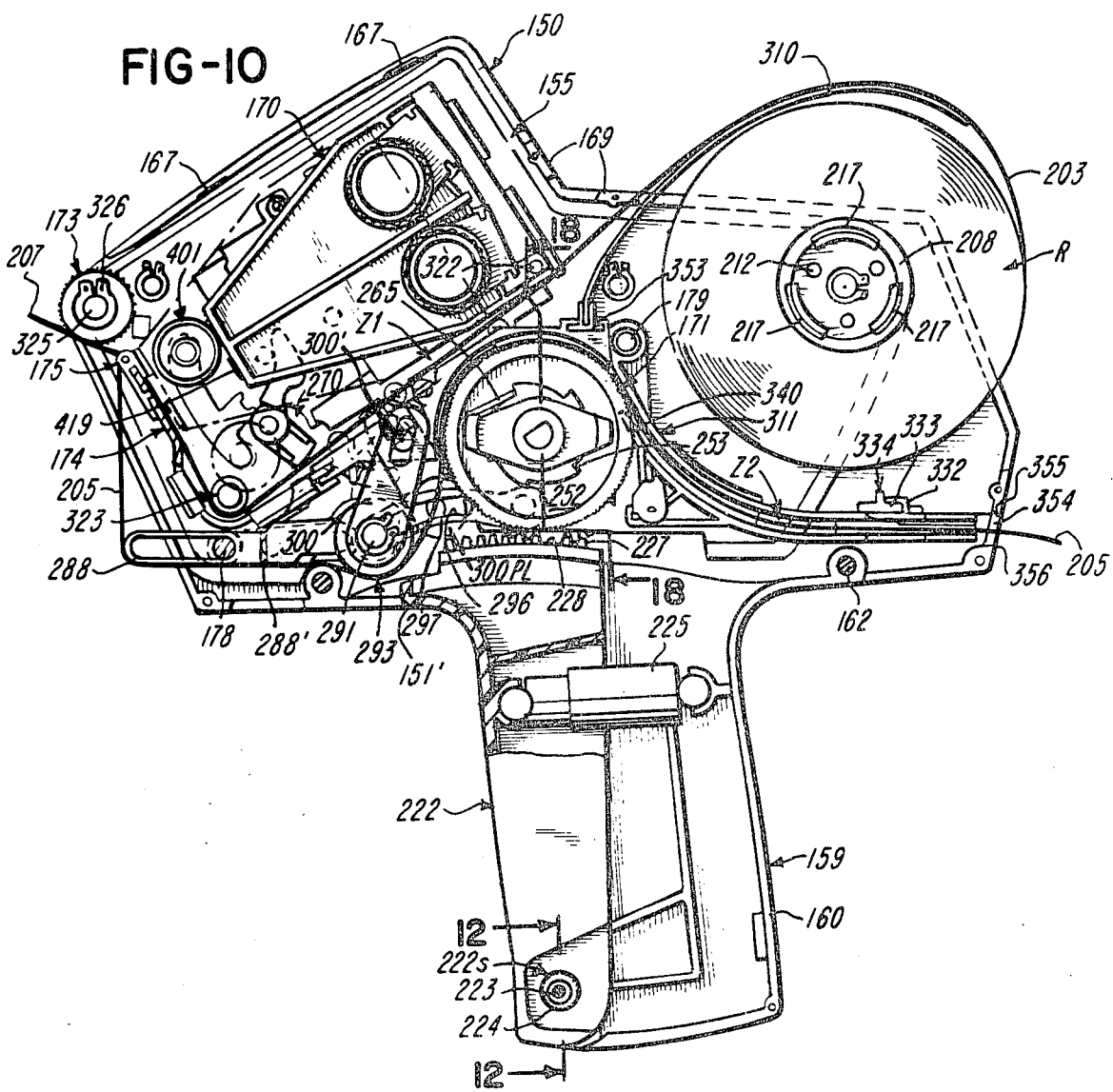

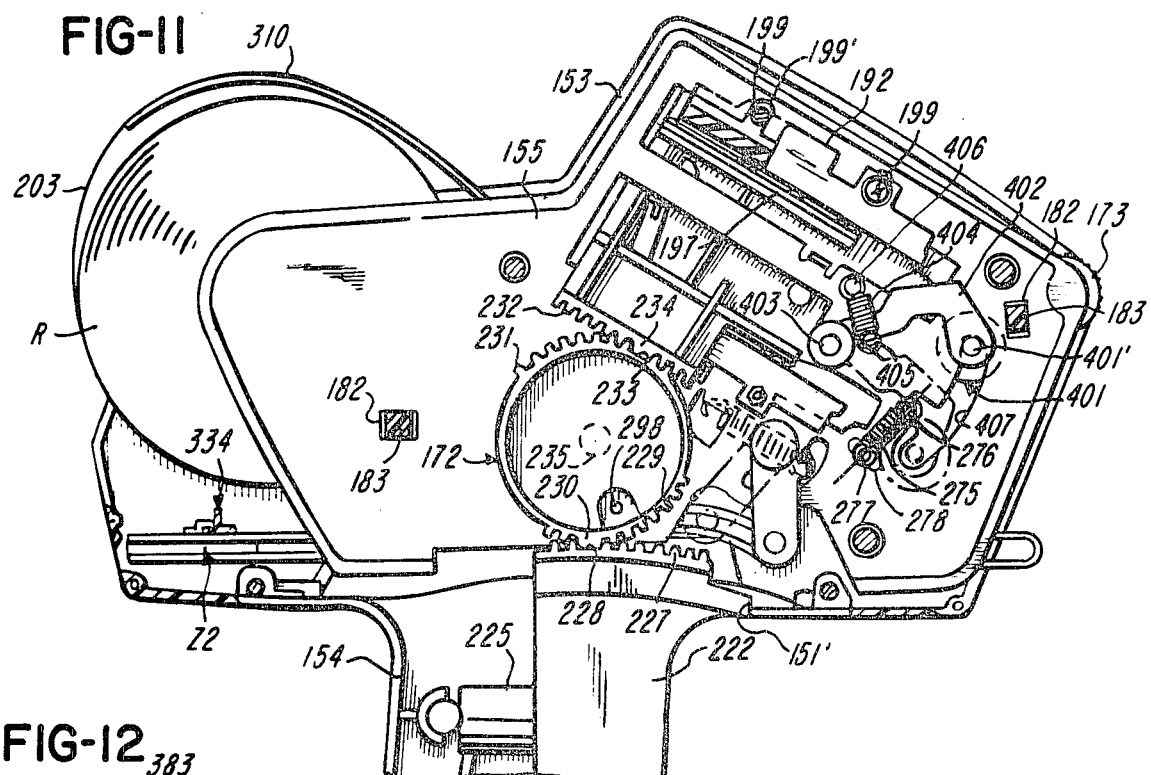
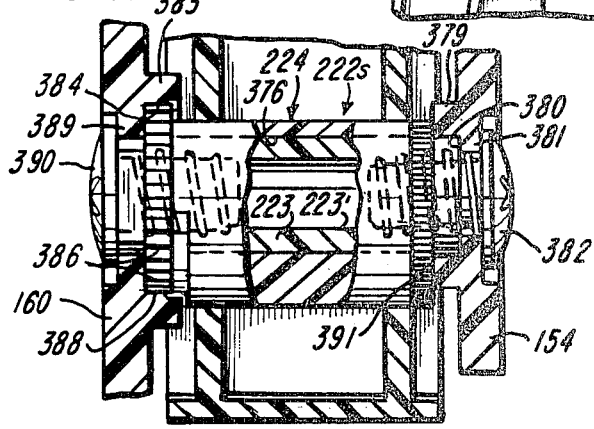
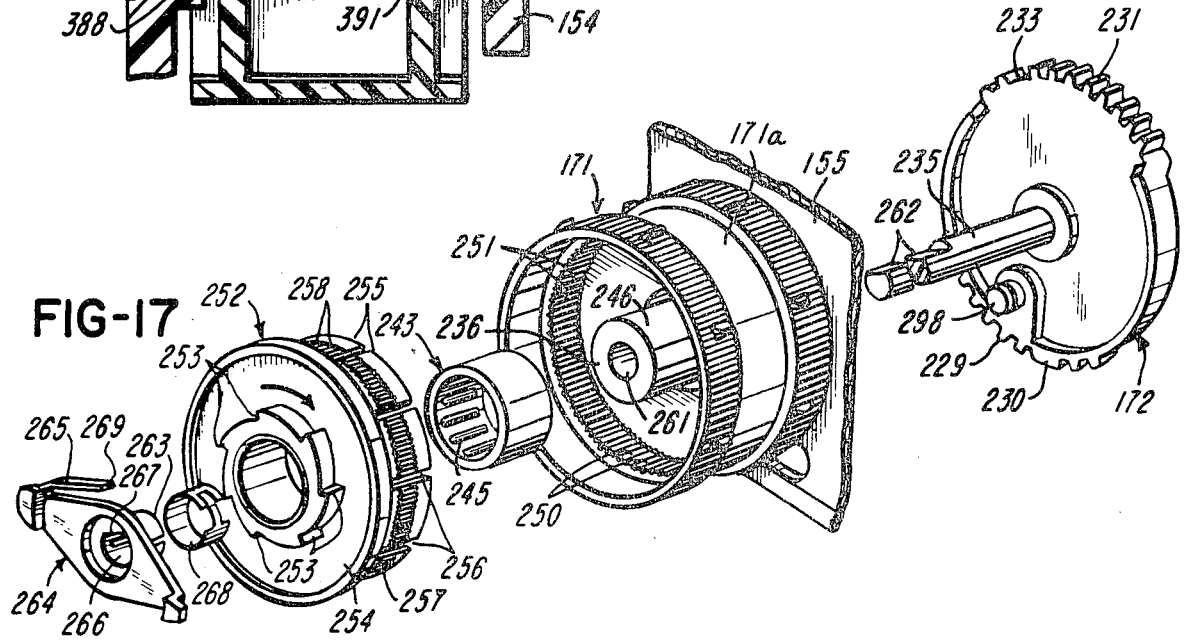

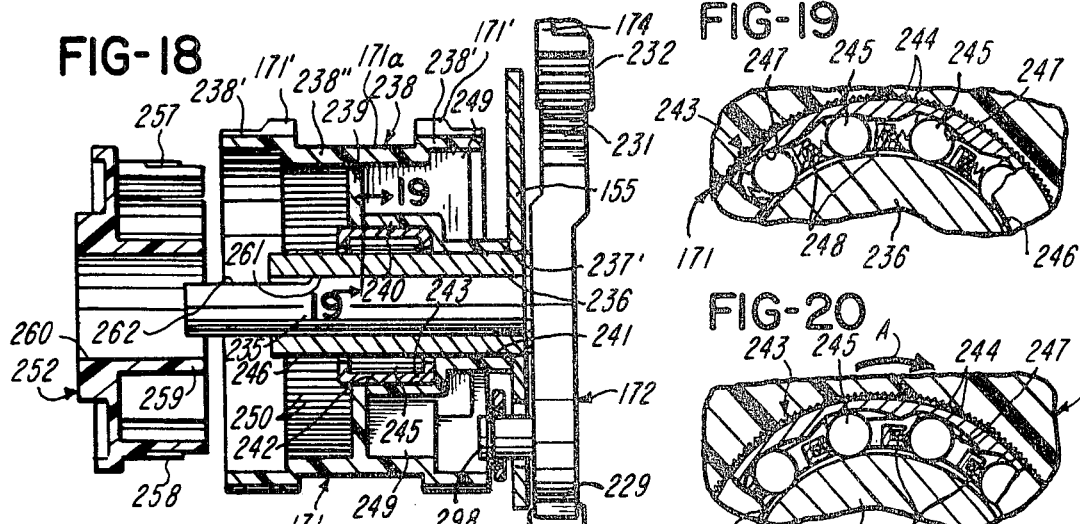

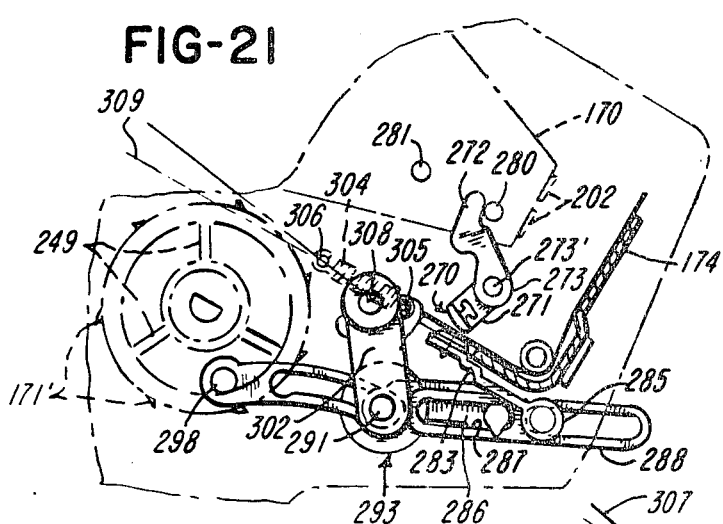
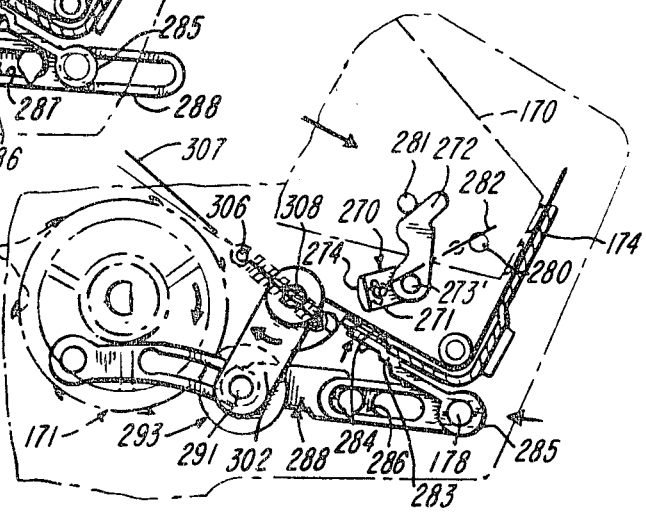
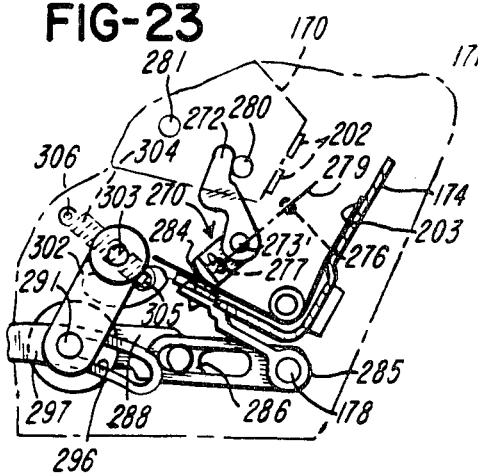
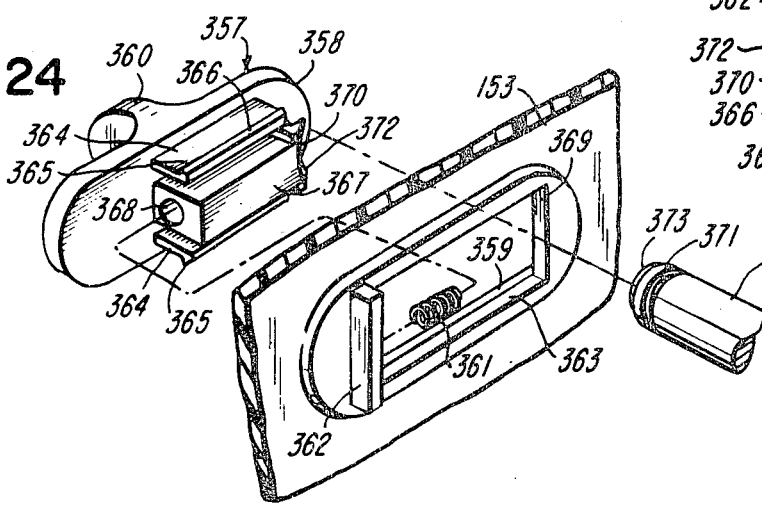
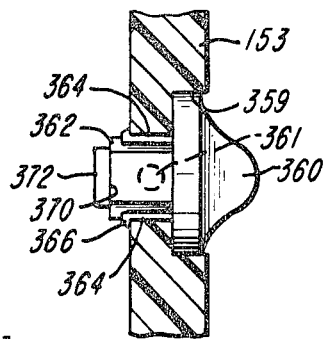

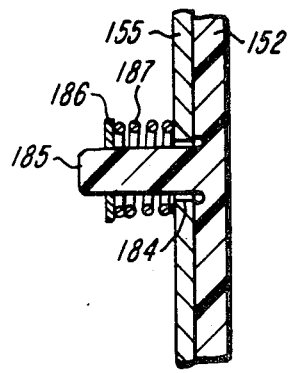
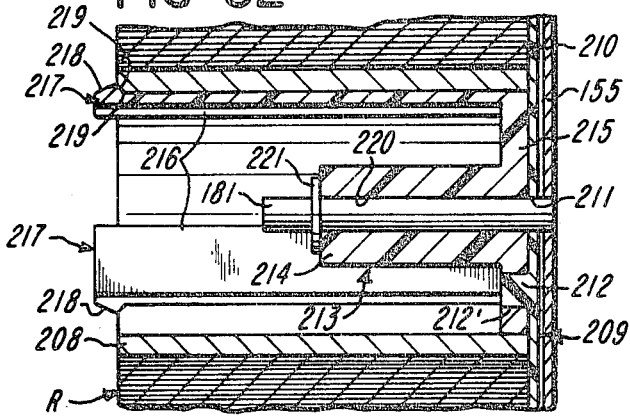
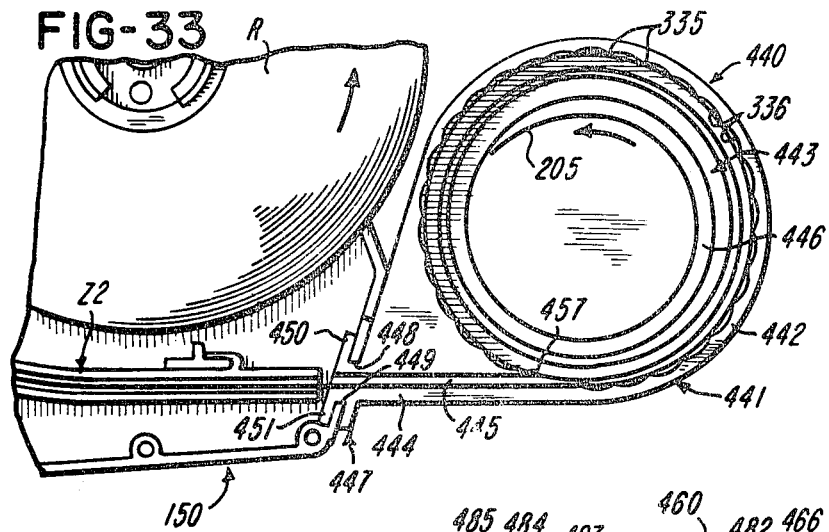
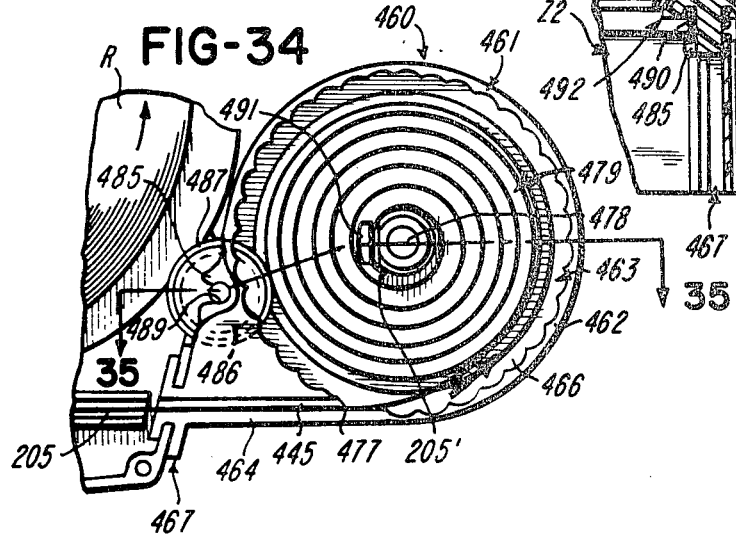

APPARATUS FOR PRINTING AND APPLYING PRESSURE SENSITIVE LABELS

CROSS-REFERENCE TO RELATED APPLICATIONS

This application is a division of copending application Ser. No. 658,431, filed Feb. 17, 1976, now U.S. Pat. No. 4,075,052, which is a division of application Ser. No. 476,744, filed June 5, 1974, now U.S. Pat. No. 3,957,562, which is a continuation-in-part of patent application Ser. No. 380,445 filed July 18, 1973, now abandoned which is a continuation-in-part of patent application Ser. No. 312,454 filed Dec. 6, 1972, now U.S. Pat. No. 3,968,745, which is a continuation-in-part of patent application Ser. No. 208,035 filed Dec. 8, 1971, now abandoned.

Certain subject matter disclosed in the present application is disclosed and/or claimed in the following applications and patents which are owned by the same assignee as the assignee of the present application: Ser. No. 205,854, filed Dec. 8, 1971, now U.S. Pat. No. 3,798,106; Ser. No. 206,061, filed Dec. 8, 1971, now U.S. Pat. No. 3,783,083; Ser. No. 312,455, filed Dec. 6, 1972, now abandoned; Ser. Nos. 366,918, now U.S. Pat. No. 3,852,139, 366,919, now abandoned and 366,826, filed June 4, 1973, now U.S. Pat. No. 3,852,140; and Ser. Nos. 449,111, now abandoned, 449,127, now U.S. Pat. No. 3,878,783 and 449,157, filed Mar. 7, 1974, now abandoned.

BACKGROUND OF THE INVENTION

1. Field of the Invention

This invention relates to the art of label printing and applying apparatus.

2. Brief Description of the Prior Art

The following U.S. patents are made of record: U.S. Pat. Nos. 2,909,301; 3,213,785; 3,261,288; 3,265,553; 3,296,962; 3,343,485; 3,369,952; 3,420,172; 3,440,123; 3,526,189; 3,551,251; 3,611,929; 3,619,324; 3,656,430; 3,705,833; 3,724,369 and 3,800,701.

SUMMARY OF THE INVENTION

The invention is directed to apparatus of the type for printing and applying pressure sensitive labels carried on a web of supporting material. It is a feature of the invention to provide a compact arrangement of parts. Such an arrangement of parts is especially desirable in a hand-held type of apparatus. The invention in one specific embodiment is more specifically directed to the mechanism having a frame, a platen, a print head movably mounted by the frame into and out of printing cooperation with the platen, a delaminator for delaminating printed labels from the supporting material web, an applicator for applying printed labels, a feed wheel having teeth for advancing the web and effecting label delamination at the delaminator, and means for moving the print head into printing cooperation with the platen and for thereafter moving the feed wheel for advancing the web, the moving means including ratchet teeth coupled to the feed wheel and a pawl for engaging the ratchet teeth, the moving means further including a first lever, a first pivot for pivotally mounting the lever to the frame, a second lever for effecting movement of the print head, a second pivot for pivotally mounting the second lever, a link, a third pivot for pivotally connecting the first lever and the link, a fourth pivot for pivotally connecting the link and the second lever so that pivotal rotation of the first lever in one direction causes pivotal rotation of the second lever in the opposite direction to effect movement of the print head into cooperation with the platen, and return spring means for returning the first and second levers, the link and the print head to their initial positions and for causing the pawl to drive the ratchet tooth and advance the feed wheel.

BRIEF DESCRIPTION OF THE DRAWINGS

FIG. 1 is an exploded perspective view of one embodiment of label printing and applying apparatus, together with a roll-type composite label web supply;

FIG. 2 is a partly broken-away top plan view of the composite label web;

FIG. 3 is a fragmentary elevational view of the apparatus shown in FIG. 1;

FIG. 4 is a fragmentary sectional view taken alone line 4—4 of FIG. 3 showing track structure for mounting a print head of the apparatus;

FIG. 5 is an enlarged fragmentary elevational view of a feed wheel for the apparatus;

FIG. 5A is a view similar to FIG. 5 but on a larger scale and showing a cured adherent coating;

FIG. 6 is an enlarged fragmentary top plan view of the feed wheel shown in FIG. 5;

FIG. 7 is a fragmentary side elevational view of an alternative embodiment of the apparatus;

FIG. 9 is a partly broken away top plan view of the composite label web;

FIG. 10 is a side elevational view of the apparatus with one handle section and a removable housing section being removed for clarity;

FIG. 11 is a fragmentary elevational view of the other side of the apparatus shown in FIG. 10;

FIG. 12 is a view taken generally along line 12—12 of FIG. 10;

FIG. 13 is a fragmentary elevational view of another handle section, showing means for locking the eccentric support in position;

FIG. 14 is a fragmentary end elevational view of a manually operable actuator and one end portion of the eccentric support;

FIG. 15 is a fragmentary elevational view showing the other side of the actuator from that shown in FIG. 14 and the other end portion of the support;

FIG. 16 is a fragmentary elevational view of the one handle section;

FIG. 17 is an exploded perspective view of a drive gear, a feed wheel, rolling-contact type one-way anti-backup clutch, a ratchet wheel selectively positionable with respect to the feed wheel, a clamp, and a drive pawl;

FIG. 18 is a partly assembled view of the components shown in FIG. 17;

FIG. 19 is a fragmentary perspective view showing how the clutch is secured in the feed wheel and clutched with an annular support;

FIG. 20 is a view similar to view 19 but showing the clutch unclutched as when the feed wheel is rotated in the direction of the arrow;

FIG. 21 is a fragmentary elevational view showing the side of the apparatus shown in FIG. 11 with certain parts omitted for clarity, the operative components being shown in FIG. 21 in a position which facilitates loading of the apparatus;

FIG. 22 is a view similar to FIG. 21 with the operative components being shown in a position caused by a first actuation of the actuator following loading;

FIG. 23 is a view similar to FIGS. 21 and 22, showing many of the operative components thereof, the brake mechanism being in its effective braking position caused by return of the print head;

FIG. 24 is a fragmentary perspective exploded view of the locking mechanism for the removable housing section;

FIG. 25 is a partly sectional view of the locking mechanism in its assembled condition;

FIG. 26 is a fragmentary perspective exploded view of a resilient device and mounting structure therefor;

FIG. 27 is a fragmentary perspective exploded view showing a delaminator and a portion of the platen;

FIG. 28 is a sectional view showing in detail an ink roll of the inking mechanism;

FIG. 29 is a sectional view taken along line 29—29 of FIG. 28;

FIG. 30 is a left end elevational view of the ink roll shown in FIG. 28;

FIG. 31 is a sectional view showing fragmentary portions of one housing section and the frame plate and the means for holding the same together;

FIG. 32 is a sectional view of the reel;

FIG. 33 is an elevational view showing a fragmentary portion of the apparatus to which a rewinder is connected;

FIG. 34 is a side elevational view of an alternate form of rewinder;

FIG. 35 is a sectional view taken along line 34—34 of FIG. 34; and

FIG. 36 is an enlarged sectional fragmentary view of the feed wheel showing lands and intervening gaps.

DESCRIPTION OF THE PREFERRED EMBODIMENTS

Figure 8:
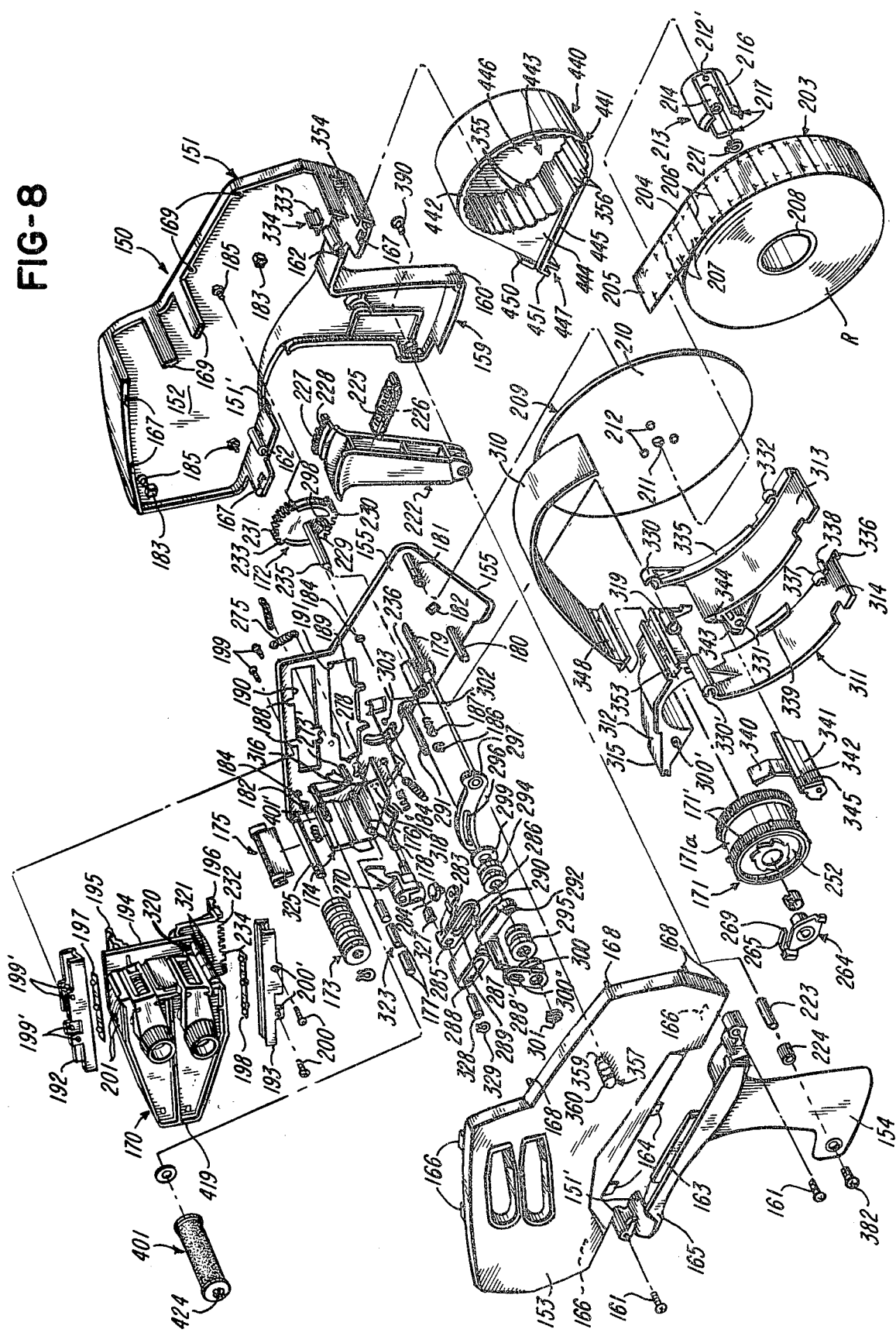
FIG. 8 is an exploded perspective view of another embodiment of label printing and applying apparatus together with an improved roll-type composite label web supply.

The embodiments of FIGS. 1 and 3 through 6 and the embodiment of FIG. 7 are adapted to utilize a composite label web 30 illustrated in detail in FIG. 2. The composite web 30 of label material 31 is releasably adhered to and carried by supporting or backing material 32. The label material 31 is cut transversely by transverse cuts 33 extending all the way across the web 31 of label material to the side edges 34 and 35 of the composite web 30. The cuts 33 known as "butt cuts" separate the web 31 of label material into a series of end-to-end labels 36. The underside of the web 31 of label material has a coating of pressure sensitive adhesive 37 which adheres strongly to the web 31 of label material. The web 32 of supporting material carries a thin film or coating (not shown) which allows the labels to be peeled from the web 32 of supporting material.

Groups 38 of cuts are provided at equally spaced-apart intervals along the length of the composite web 30. Each group 38 of cuts is shown to extend through the supporting material as well as through the label material. Each group of cuts is shown to be made in a generally I-shaped configuration comprised of cuts 39S, 40S and 41S in the supporting material and aligned cuts 39L, 40L and 41L in the label material. The part of the web 32 between the one end of the cut 39S and the cut 40S provides a frangible portion 43S and the part of the web 32 between the other end of the cut 39S and the cut 41S provides frangible portion 42S. In like manner, the part of the label material between the end of the cut 39L and the cut 40L provides a frangible portion 43L and the part between the other end of the cut 39L and the cut 41L provides a frangible portion 42L.

With reference to the embodiment of FIGS. 1 and 3 through 6, there is shown label printing and applying apparatus generally indicated at 50. The apparatus 50 has a frame generally indicated at 51 which is shown to include frame sections 52 and 54 to which a cover section 53 is removably connected. A subframe 55 in the form of a single, rigid, metal plate is suitable secured to the frame section 52 as for example by screws 56. The screws 56 pass through respective holes 57 in the subframe 55, and are threadably received in respective bosses 58 in the frame section 52. The frame 51 has a handle generally indicated at 59 comprised in part of handle portion 60 of the frame section 52 and in part by the frame section 54. The sections 53 and 54 are connected to the frame section 52 by snap-fit connections including generally snap-fitted flexible resilient members 61 engageable in undercut recesses 62 in the housing section 52.

The subframe 55 mounts a print head generally indicated at 63, a feed wheel 64, a ratchet wheel 65 (FIG. 3) formed integrally with the feed wheel 64, a gear or gear segment 66 formed integrally with a lever 67, an applicator 68 in the form of a roll, a platen 69 and an integral guide 69', a delmainator 70 provided by an edge of the platen 69, rollers 71 and 72, a post or stud 73, a post or stud 74, a post or stud 75, and a stripper plate 76 and an integrally formed guide 77. The handle portion 60 and the frame section 54 mount a pivot 78 in respective bosses 79 and 80. The pivot 78 pivotally mounts an actuator 81 shown to be in the form of a lever. When the user grips the handle 59, the actuator 81 can be engaged by the user's fingers, while the thumb passes around the frame section 54 (assuming the user grips the handle 59 with the right hand). The actuator 81 carries a gear or gear segment 82 which meshes with the gear 66. A spring assembly 82', including a compression spring 83, bears against the handle portion 60 and the actuator 81 and urges the actuator 81 counterclockwise (FIGS. 1 and 3). The spring assembly 82' is shown in greater detail in FIGS. 45 through 48 in above-mentioned U.S. Pat. No. 3,968,745. Accordingly, the actuator 81 and the gear 82 are initially in the position shown by solid lines in FIG. 3, but upon operation are moved to the position indicated by phantom lines 81'. The feed wheel 64, the ratchet wheel 65, and the gear 66 are coaxially mounted on the post 74. The gear 66 carries a pawl 83 which is cooperable with the ratchet wheel 65. As the actuator 81 moves from the solid line position to the phantom line position in FIG. 3, the gear 66 rotates counterclockwise until the pawl 83 passes over a tooth 84 of the ratchet wheel 65, and when the actuator 81 is released the spring assembly 82' drives the gear 66 clockwise and causes the pawl 83 to drive the feed wheel 64 clockwise. Clockwise rotation of the ratchet wheel 65 and hence the feed wheel 64 is prevented by a flexible resilient pawl 84' which cooperates with the ratchet wheel 65.

The lever 67 lies in a plane which is offset from the plate of the gear 66. As best shown in FIG. 1, a lateral portion 85 integrally connects the gear 66 and the lever 67. The lateral portion 85 passes through an arcuate slot 86' in the subframe 55. The lever 67 is connected to the print head 63 by a pin-type connection generally indicated at 86. The pin-type connection 86 is a pin-and-slot connection and is shown to comprise an elongated slot 87 in the lever 67 and a pin 88 having a roller 89 received in the slot 87. A washer 90 and a clip 91 hold the roller 89 on the pin 88. The pin 88 is secured to the print head 63. As best shown in FIGS. 1 and 4, the print head 63 is provided with a pair of elongated parallel ball tracks 92 and 93. The subframe 55 mounts a pair of ball tracks 94 and 95. Ball bearing strips 96 and 97 are received in respective ball tracks 92 and 94, and 93 and 95. Such ball bearing strips are shown in greater detail in FIGS. 12 and 24 of above-mentioned U.S. Pat. No. 3,968,745. The ball tracks 92 through 95 are considered to comprise track structure for mounting the print head 63 for reciprocating movement toward and away from the platen 69. The ball track 95 is mounted to move relative to the ball track 93. Compression springs 95' urge the ball track 95 toward the ball track 93 and compensate for clearance between the ball tracks 93 and 95.

The apparatus 50 provides what is known as a two-line machine, having two lines L1 and L2 of selectively settable printing bands 98 and 99. The bands 98 of line L1 are selectively settable by manual operation of a knob 100 and the bands 99 of line L2 are selectively settable by manual operation of a knob 101. The knobs 100 and 101 project through an opening 53' in the cover section 53.

A die roll 64a, having a groove 64b through which the teeth 64' of the feed wheel 64 can pass, is rotatably mounted on an arm 64c. The arm 64c is mounted on the post 73. The arm 64c has an integral lateral tab 64g which extends through a slot 64f in the subframe 55. A tension spring 64d is connected to a post 64e secured to the subframe 55 and to the tab 64g. The spring 64d urges the die roll 64a against the feed wheel 64. When the feed wheel 64 rotates, the teeth 64a of the feed wheel 64 cooperate with the die roll 64a to break the frangible portions 42S and 43S in the supporting material web 32, thus making feed holes in the supporting material web 32.

An inking mechanism 102 includes an arm 103 pivotally mounted on a pivot 104 secured to the subframe 55. A retainer 105 keeps the arm 103 on the pivot 104. The arm 103 carries a small diameter laterally extending pin 106 which mounts an ink roll 107. The pin 106 extends through an arcuate slot 108 in the subframe 55. A tension spring 109 acts at its one end on a lateral tab 110 carried by the arm 103 and at its other end on a pin 111 secured to the print head 63. The locations of the tab 110 and the pin 111 are selected so that there is substantially no extension or distention of the spring 109 as the print head 63 moves during the printing stroke between the solid line position and the phantom line (printing) position shown by phantom lines 63'. Likewise on the return stroke there is no substantial extension or distention of the spring 109 as the print head 63 moves between these positions. The location of the pivot 104 causes the ink roll 107 to be pushed from its solid line position to the phantom line position indicated by phantom lines 107' during the printing stroke from which the ink roll 107 is returned to the solid line position during the return stroke of the print head 63. In addition, the force of the spring 109 causes the ball track 92 to be urged toward the ball track 94, thereby compensating for clearance.

The composite label web in roll form can have a circular cylindrical core 112 composed of paperboard or other suitable material. A hub 113 composed of plastic or other suitable materials has three flexible resilient sections 114 onto which the core can be snap-fitted and from which the core 112 of a spent roll can be readily removed. The hub 113 is rotatably mounted on the post 75 and is retained by a clip 113'.

With reference to FIGS. 5 and 6, the periphery of the feed wheel 64 is shown to have evenly spaced apart generally V-shaped lateral grooves 115. These grooves 115 greatly reduce the area of contact that the supporting material web 32 makes with the feed wheel 64. This greatly minimizes any tendency for gum which may be on the supporting material web 32 to be transferred to the feed wheel 64. Gum on the feed wheel 64 can cause problems in feeding the composite web 30. Lands 116 at the periphery of the feed wheel 64 are about one-fifth as long as the pitch distance $d$, and thus the grooves 115 reduce the area of contact by 80 percent over a feed wheel with a continuous, uninterrupted periphery.

In loading the apparatus 50, the cover section 53 is unsnapped and removed, and the composite label web supply roll is snapped onto the hub 113. The die roll 64a and its arm 64b are moved to the over-center position. With the actuator 81 moved partly toward the phantom line position (FIG. 3), the free end of the composite web 30 is passed between a brake roll 117 and a plate 118 secured to the subframe 55. The free end of the composite web 32 is passed under and partly around roller 71, over the platen 69, around the delaminator 70, under the platen 69, under and partly around the roller 71, partly around the roller 72, over and partly around the feed wheel 64, over the stripper plate 76, and over the guide 77. Now the actuator 81 can be released, whereupon the brake roll 117 is contacted by the end of the print head 63, causing the brake roll 117 to press the web 30 against the plate 118 to prevent paying out of the web 30 during application of a label 36. The die roll 63 and its arm 64 can now be moved to the position shown in FIG. 3, and the cover section 53 can be snapped into place.

When it is desired to print and apply a label 36, the printing and feeding cycle is commenced when the actuator 81 is squeezed, and this causes the gear 82 to drive the gear 66 and hence the lever 67. Pivoting of the lever 67 causes the print head 63 to be driven into printing cooperation with the platen 69 to print data on a label 36. When the actuator 81 is released, the pawl 83 drives the feed wheel 64 to feed the label 36 that was just printed into label applying position relative to the applicator 68, in this position the trailing edge of the label 36 is still adhered to the supporting material web 32. Also the next successive label 36 is properly positioned on the platen 69 for printing during the next printing cycle.

In the embodiment of FIG. 7 the same reference characters are applied to functionally similar parts as those disclosed in the embodiment of FIGS. 1 and 3 through 6. Referring to FIG. 7, the actuator 81 carries a pivot 130. A link 131 is pivotally connected to the pivot 130. A pivot 132 carried by the link 131 pivotally connects the link 131 and a lever 133. The lever 133 is pivotally mounted by the post 74. The lever 133 carries a pawl 134 which performs the same function as the pawl 83 (FIG. 3). The pin-type connection 86 is provided by a pivot 135 secured to the print head 63 which extends through a circular hole 136 in the lever 133. Instead of being provided with the track structure of the embodiment of FIGS. 1 and 3 through 6, subframe 55 in the embodiment of FIG. 7 has track structure provided by an elongated slot 137. The print head 63 carries a pin 138 which mounts a roller 139. The roller 139 is received in the slot 137. In that the pin 135 follows a slight arc as the lever 133 moves, the right end of the print head 63 also travels in a slight arc. The left end of the print head 63 has movement which is essentially reciprocating in that the roller 139 moves in a straight line. When the print head 63 is in the printing position, the pivot 135 is in the position indicated by phantom lines 135' and in this position the print head 36 is perpendicular to the platen 69. When the actuator 81 is released the spring assembly 82' (FIG. 1) causes the actuator 81 to pivot counterclockwise which drives the lever 133 clockwise to return the print head 63 to the position shown in FIG. 7, and at the same time the pawl 134 drives the feed wheel 64 to advance the composite web 30 a distance equal to the length of one label 36. In the embodiment of FIG. 7, the gear 82 has been eliminated from the actuator 81.

The apparatus of the embodiments of FIGS. 1 and 3 through 6, and 7, is constructed mainly of molded plastic material. The subframe 55 is preferably composed of steel. The actuator 81, the gear 66 and lever 67, the ratchet and feed wheels 65 and 64, a substantial portion of the print head 63, sections 52, 53 and 54, the hub 113, and tracks 94 and 95 are composed of a suitable molded plastic material. With reference to FIG. 7, link 131 and lever 133 are also composed of plastic material.

In practice it has been found that, in some instances, minor amounts of gummy pressure-sensitive adhesive remains on the supporting web 32 after the labels have been separated. If this occurs, when the supporting web is contacted with the feed wheel 64 transfer of this gummy substance to the feed wheel can be encountered, which during continued use of the apparatus, may interfere with efficient operation.

The feed wheel 64 has a web contacting surface 116 of both disclosed embodiments of the invention treated to provide a coating 116' having non-stick or release properties sufficient to substantially retard or prevent transfer of gum or pressure-sensitive adhesive, which may be present on the supporting web 32, to the feed wheel. Preferably the web contacting surface of the feed wheel should readily release a pressure-sensitive tape (e.g., 3M Transparent Tape 5910) after the pressure-sensitive tape has been applied to the feed wheel under 10 p.s.i. pressure for 2–5 seconds.

A particularly preferred method of imparting enhanced release properties to the feed wheel, formed from a metal, or an organic polymeric plastic material, such as polyacetal resins (e.g., Delrin), polycarbonate resins (e.g., Lexan), phenylene oxides (e.g., Noryl), nylons (e.g., Nylafil, Zytel, Nylatron), acrylonitrile-butadiene-styrene resins (e.g., Cycloac-ABS Resin), unsaturated polyester molding resins and the like, is to apply to the supporting web contacting surfaces of the feed wheel an adherent continuous coating of a resinous coating composition having a lower surface energy than the substrate polymeric material from which the wheel is formed. The presently preferred coating compositions include those based on a material such as moisture cured, one component, all silicone resins theretofore utilized in the art for forming aircraft and maintenance protective finishes, and solvent based paper curable coating compositions based on silicone polymers heretofore described in the art as useful in forming release paper for pressure-sensitive adhesive compositions. Since the coating must have sufficient adhesion to the feed wheel so that it is not removed during use, it may be desirable to etch or otherwise slightly roughen the surface to be coated prior to applying and curing the coating.

This preferred method is distinguishable from the method in which the surface of the feed wheel which contacts the web has means providing material possessing release properties sufficient to retard the accumulation of gum by incorporating a lubricant in the feed wheel while the feed wheel is molded, in accordance with above-mentioned Ser. No. 366,919, and it is also distinguishable from the method in which a liquid lubricant is applied to the feed wheel for this purpose in accordance with above-mentioned U.S. Pat. No. 3,968,745. While these other methods are advantageous, the preferred method is more effective for longer periods of time.

With reference to the embodiment of FIGS. 8 and 10 through 36, there is shown label printing and applying apparatus generally indicated at 150. The apparatus 150 has a frame generally indicated at 151 which is shown to comprise a frame or housing having housing sections 152, 153 and 154 and a subframe comprising a single, rigid, metal frame plate 155. The housing is essentially closed. The frame 151 has a handle generally indicated at 159 comprised in part of a handle portion 160 and in part of the frame section 154. The housing section 154 is secured to the housing section 152 by screws 161 received in respective threaded holes 162. The frame section 154 is positioned in front of a lip 163 of the section 154 and projections 164 on the section 153 extend behind a wall 165. The section 153 is connected to the section 152 by snap-fit connections including generally snap-shaped flexible resilient members 166 engageable in respective undercut recesses 167 in the section 152. The section 153 is also provided with locating studs 168 received in respective recesses 169 of the section 152.

The frame plate 155 mounts a print head 170, a feed wheel 171, a gear or gear segment 172, an applicator 173 shown to be in the form of a roll, a platen 174, a delaminator 175, a mounting pin 176 and a plurality of rollers 177, mounting posts 178, 179, 180 and 181, and a support 236.

The frame plate 155 is provided with two spaced-apart precisely located rectangular holes 182 in which respective square mating locating pins or studs 183 are received. The holes 182 extend at right angles to each other and the two opposed side faces of each stud contacts the corresponding long sides of the respective rectangular hole 182. The pins 183 are cooperable with the respective holes 182 to locate the frame plate 155 previsely relative to the housing section 152. There are three identical hold-down connections which secure the frame plate 155 to the housing section 152, although only one is shown in detail in FIG. 31. The frame plate 155 has three enlarged holes or cutouts 184. The housing section 152 has pins or studs 185 which extend through the cutouts 184. With reference to FIG. 31, a retainer in the form of a grip ring 186 grips a stud 185. A compression spring 187 received about the stud 185 bears against the frame plate 155 and against the retainer 186. With age and continued use of the apparatus the stud 185 tends to elongate. The spring 187 insures that the plate 185 will always be held solidly against the housing section 152. In that the stud 185 is considerably smaller in diameter than the cutout 184, location of the frame plate 155 relative to the housing section 152 remains to be accomplished by the pins 183 in respective recesses 182.

The frame plate 155 has a pair of elongated cutouts or open ended slots 188 and a pair of oppositely facing elongated cutouts or open ended slots 189. The slots 188 and 189 communicate with larger respective cutouts 190 and 191. Oppositely facing ball tracks 192 and 193 are received in respective cutouts 190 and 191. The print head 170 comprises a print head frame 194 having a pair of oppositely facing ball tracks 195 and 196. A ball bearing strip 197 is received in mating ball bearing tracks 192 and 195 and a ball bearing strip 198 is received in mating ball bearing tracks 193 and 196. The ball tracks 192 and 193 are shown to be generally channel-shaped in construction. When the ball tracks 192 and 193 are in the position as shown in FIGS. 10 and 11, the ball tracks 192 and 193 are received by the frame plate 155. Threaded fasteners 199 extend through the cutouts 188 and are threadably received in holes 199' in the ball track 192. Similarly, threaded fasteners 200 extend through cutouts 189 and are threadably received in holes 200' in the ball track 193. The print head 170 is capable of printing two lines of data in that the print head 170 has two lines of printing bands as shown in detail in FIGS. 31 of above-mentioned U.S. Pat. No. 3,968,745. It is important to printing quality that the print head 170 move relatively to the platen 174 such that the characters on the printing bands 201 contact the label 207 on the platen uniformly. If the print head 170 is improperly aligned with the platen 174, some of the selected characters will be printed and others will not be printed at all or will only be faintly printed. In that the cutouts 188 and 189 are larger than the diameters of fasteners 199 and 200 which extend therethrough, the ball tracks 192 and 193 can be precisely positioned during manufacture of the apparatus so that the print head 170 is precisely aligned with the platen 174 and so that clearance between the ball tracks and their respective ball bearing strip is held to a minimum. Print head frame 194 and the ball tracks 195 and 196 which are molded integrally therewith and the ball tracks 192 and 193 are composed of plastics material. The balls of the ball strips 197 and 198, are like those shown in FIGS. 12 and 24 in above-mentioned U.S. Pat. No. 3,968,745, are comprised of a hard material such as steel. As shown diagrammatically in FIGS. 21 through 23, the type characters or faces 202 extend parallel to the platen 174. The print head 170 is caused to move in a straight line because all the ball tracks 192 through 195 are straight. Consequently, for quality printing the print head 170 should move perpendicularly with respect to the platen 174. There is thus provided means whereby the travel of the print head into printing cooperation with the labels of the composite web can be adjusted during manufacture or even subsequent thereto to insure precise alignment of the print head 170 with the platen 174.

The apparatus 150 is shown to utilize a composite web 203. The composite web 203 of label material 204 is releasably adhered to supporting a backing material 205. The label material 204 is cut transversely by bar cuts or slits 206 extending all the way across the web 204 of label material, thereby separating the label material 204 into a series of end-to-end labels 207. The composite web 203 is wound onto a circular cylindrical core 208 composed of paperboard or other suitable material. The composite web roll is mounted on a reel generally indicated at 209. The reel 209 is comprised of a generally flat disc 210 having a central hole 211. Disc 210 has a plurality of equally spaced-apart pins 212 disposed at equal distances from the central hole 211. The disc 210, the hole 211 and the integral pins 212 are formed when the disc 210 is molded in an injection molding machine. The reel 209 also includes a hub generally indicated at 213. The hub 213 has a central tubular hub portion 214 joined to an end wall 215. The pins 212 are received in mating holes 212' in the end wall, thereby keying the disc 210 and the hub 213 for rotation together as a unit. Spaced outwardly from the hub portion 214 and joined integrally to the end wall 215 are a plurality of flexible, resilient, cantilever mounted fingers 216. The fingers 216 extend slightly outwardly and away from each other while the core 208 is disposed thereon. The free ends of the fingers 216 have projections 217. Each of the projections 217 has a pair of sloping faces 218 and 219. The face 218 facilitates loading of the label roll onto the hub 213, and the face 219 provides a ramp which prevents accidental shifting of the roll off from the hub 213, but enables the spent core 208 to be readily removed by the user. When the supply roll is loaded onto the reel 209 and when the spent core 208 is removed, the fingers 216 deflect inwardly. The post or shaft 181 extends through the hole 211 in the disc 210 and through a bore 220 in the hub portion 214. A retainer 221 received by the marginal end of the shaft 181 prevents the reel 209 from shifting off the post or shaft 181 and prevents the hub 213 from separating from the disc 210 so that the pins 212 do not loose engagement with the holes 212'. The hub 213 is also injection molded. The disc 210 defines one edge of the feed path so that the composite web 203 which is paid out of the roll starts in precise alignment with the platen 174 and the feed wheel 171.

An actuator generally indicated at 222 is shown to take the form of a pivotally operated lever mounted by support structure generally indicated at 222s including a pivot pin 223 received in an eccentric 224 in the form of a sleeve. The actuator 222 is urged in a counterclockwise direction (FIGS. 8 and 10) by a spring assemby 225 shown in greater detail in FIGS. 45 through 48 and described in the accompanying description of parent U.S. Pat. No. 3,968,745. Briefly stated, the spring assembly 225 includes a compression spring 226.

The actuator 222 carries a gear or gear section 227 having an opening 228 provided by a missing tooth. The gear section 227 is in meshing engagement with the gear section 229 of the gear 172. The gear section 229 has one large tooth 230 which meshes with the teeth adjacent the space 228. In that the tooth 230 can only fit into the opening 228, the actuator 222 can only be assembled in the proper relative position with respect to the gear 172. The gear 172 also has a gear section or segment 231 in meshing engagement with the gear section or rack 232 formed integrally with the print head frame 194. The gear section 231 has an opening 233 provided by a missing tooth and the gear section 232 has one large tooth 234 received in the opening 233 so that the print head 170 can only be assembled in the proper relative position with respect to the gear 172. Assuming the handle 159 is being held in the user's hand, the user's fingers can operate the actuator 222 to pivot the actuator 222 clockwise (FIGS. 8 and 10) against the force of the spring 226 in the spring device 225, thereby causing the gear 172 to rotate counterclockwise to in turn drive the print head 170 into printing cooperation with a label 207 which is disposed in overlying relationship on the platen 174. Release of the actuator 222 enables the spring 226 to return the actuator 222, the gear 172, and the print head 170 as well as other components to be described below, to their initial positions. Sections 152 and 154 have stops 151'.

A drive shaft 235 is molded integrally with the gear 172. A support 236 in the form of a tube or tubular bearing is suitably secured in a hole 237 in the frame plate 155 as best shown in FIGS. 18. The feed wheel 171 has a plurality of pairs of transversely spaced-apart teeth 171' which engage the supporting material web 245, as is described below in greater detail. The teeth 245 are shown exaggeratedly in FIG. 21 to be inclined in the forward direction so as to catch the feed edges in the web 205. The feed wheel 171 is shown to include a rim 238 to which the teeth 171' are integrally joined. The rim 238 is comprised of annular peripheral web engageable sections or beads 238' and an intervening space or gap provided by an annular section 238" having a reduced or lesser diameter than the sections 238'. As shown in FIG. 36, the sections 238' having lands 116a which are shown to comprise relatively sharp ridges so as to provide essentially line contact between the web 205 and the lands 116a. Gaps in the form of grooves 115a between the lands 116a and the section 238" reduce the contact area to a very small percentage, less than 50 percent and as illustrated preferably less than ten percent of the peripheral area which would otherwise constitute the surface area of the feed wheel 171. Some adhesive, gum or the like that adheres to the feed wheel 171 will collect in the gaps 115a, but because of this, the external diameter of the feed wheel 171 as defined by the lands 116a will not increase; such an increase in diameter would be detrimental in that it would increase the lengths of the web which the feed wheel 171 would feed upon each actuationg of actuator 222. By way of example not limitation, the depth of the gaps 115a is about 0.025 inch and each section 238' has 119 lands 116a. Although the lands 116a are characterized as being sharp they do not cut into the web 205. Feeding is brought about through engagement of the teeth 171' with the web. The feed wheel being comprised at least at its periphery of plastics material (which inherently has a low coefficient of friction). Additionally, the peripheral surface of the feed wheel 171 is preferably coated with either a liquid or a permanent coating of a material that tends to retard the accumulation of adhesive, gum or the like, or to incorporate a suitable lubricant along with the plastics material from which the feed wheel 171 is molded. An annular wall 239 joins the rim 238 and a hub portion 240. The hub portion 240 has a bore portion 241 which merges into a larger bore portion 242. The bore portion 242 is provided with projections comprised of a great number of grooves and ridges or flutes 244 which extend in the axial direction. A rolling-contact type one-way clutch 243 is received in the bore portion 242. The initial internal diameter of the bore portion 242 defined by the crests of the projections, that is, ridges 244 is less than the outer diameter of the clutch 243. The clutch 243 is assembled into the feed wheel 171 by forcing the clutch 243 into the bore portion 242 and the ridges 244 yield slightly and frictionally hold the clutch 243 in the position shown in FIG. 18. The clutch 243 has a plurality of rollers 245 which contact the outer circular cylindrical surface 246 of the support 236. The one-way clutch 243 acts as a bearing and enables the feed wheel 171 to rotate clockwise as viewed in FIGS. 8 and 17 but prevents counterclockwise movement. By way of example not limitation, a specific embodiment of a clutch which is useful in the present invention is made by The Torrington Company, Torrington, Connecticut 06790 U.S.A. and is described in their catalog RC-6, Copyright 1969, and is referred to as a roller clutch, catalog No. RC-081208.

A fragmentary portion of the clutch 243 is shown in FIGS. 19 and 20. In the position shown in FIG. 19, the clutch 243 is preventing the feed wheel 171 from rotating counterclockwise in that the rollers 245 are in wedging contact with respective inclined surfaces 247, whereas in FIG. 20 the feed wheel 171 is shown to be rotating in the direction of arrow A and the rollers 245 are not binding between the surfaces 247 and the surface 246. The clutch 243 is spring loaded in that springs diagrammatically indicated at 248 urge the rollers 245 continuously against both the surfaces 246 and 247 so that any backlash of the clutch 243 is negligible and is substantially less than in the event a pawl such as the pawl 248 of parent U.S. Pat. No. 3,968,745 is used. The feed wheel 171 also includes webs 249 which join the rim 238, the wall 239, and the hub 240. The inner periphery of the rim 238 on one side of the wall 239 has a plurality of grooves 250 and ridges 251 in an annular arrangement. The grooves 250 and ridges 251 extend in the axial direction. A ratchet wheel generally indicated at 252 has a plurality of ratchet teeth 253. The teeth 253 are formed integrally with one side of a wall 254. An annular wall or flange 255 shown to have a plurality of equally spaced-apart openings 256 has a plurality of grooves 257 and ridges 258. The grooves 250 and ridges 251 and the grooves 257 and ridges 258 have the same pitch and are complementary with respect to each other. The ratchet wheel 252 also has an annular hub 259 with an internal bore 260. The support 236 is adapted to extend into the bore 260 to a position in which the end of the hub 259 contacts one end of the clutch 243. In this position, the ridges 258 and grooves 257 of the ratchet wheel 252 are recieved respectively in the complementary respective grooves 250 and ridges 251 of the feed wheel 171. By moving the ratchet wheel out of its assembled position to the position shown in FIG. 18, the position of the ratchet wheel 252 relative to the feed wheel 171 can be selectively changed. Such a change will result in a change of registration of the label 207 at the printing zone between the print head 170 and the platen 174 and in a change in position to which the web 205 and the leading label 207 are advanced relative to the delaminator 175. The mechanism by which this is accomplished is similar in some respects and different in others from that disclosed in U.S. Pat. No. 3,783,083.

The grooves 250 and ridges 251 cooperable with respective ridges 258 and grooves 257 key the feed wheel 171 and the ratchet wheel 252 together against relative rotation. Also the feed wheel 171 and the ratchet wheel 252 can rotate only in one direction due to the action of the clutch 243.

Drive shaft 235 is rotatably mounted in a circular cylindrical bore 261 in the support 236. The drive shaft 235 receives a split yieldable hub 263 of pawl structure generally indicated at 264. The pawl structure 264 includes a pawl 265 which is cooperable with the teeth 253 one-at-a-time as seen for example, in FIG. 10. Like the gear 172, the feed wheel 171 and the ratchet wheel 252, the pawl structure 264 is composed of molded plastics material. The split hub 263 has an internal bore 266 with a flat 267 which is received against a flat 262 on the shaft 235. A clamp 268 is received about the hub 263. The clamp 268 places the split hub 263 under hoop compression so that the pawl structure 264 is securely and reliably but removably mounted on the shaft 235. Because of the cooperable flats 262 and 267 and because the drive shaft 235 is formed integrally with the gear 232, the pawl structure 264 and the gear 172 rotate as a unit. When the operator 222 is pivoted clockwise, as viewed in FIGS. 8 and 10, the gear 172, as previously described, rotates counterclockwise. Counterclockwise rotation of the gear 172 causes the pawl structure 264 to also rotate counterclockwise, thereby bringing the pawl 265 into driving relationship with the next successive tooth 253. Upon release of the actuator 222, the return spring 226 causes the gear 172 and the pawl structure 264 to rotate clockwise. Accordingly, the drive end 269 of the pawl 265 drives the ratchet wheel 252 and the feed wheel 171 in a clockwise direction, thereby causing advance of the composite web 203.

With reference to FIGS. 21 through 23 there is shown a brake mechanism generally indicated at 270. The brake mechanism 270 includes a brake member 271 and an arm 272 integrally joined by a hub 273. The hub 273 is pivotally mounted on a stud 273' secured to the frame plate 155. The brake member 271 includes a flexible resilient brake shoe 274 for applying a braking force against the composite web 203. A tension spring 275 (FIGS. 8 and 11) is connected at one end to a turned-up tab 276 of the frame plate 155 and at its other end to a post 277 formed integrally with the brake member 271. The post 277 extends through an arcuate slot 278 in the frame plate 155 and the spring 275 connects the tab 276 and the post 277 on the front side of the frame plate 155 as viewed in FIG. 11. The tab 276 and the post 277 are so situated relative to the axis of the stud 273' that the spring 275 normally urges the brake member 271 and the arm 272 into one of two overcenter positions. In FIG. 23, the spring 275 is exerting a spring force along centerline 279.

The print head 170 is shown to be provided with a pair of spaced-apart abutments 280 and 281. In the retracted position of the print head 170 shown in FIG. 23, the arm 272 is against the abutment 280 and the brake shoe 274 is in contact with the composite web 203 upstream of the platen 174. Upon operation of the actuator 222, the print head 170 is driven from the retracted position shown in FIG. 23 to the extended position shown in FIG. 22, causing abutment 281 to contact and pivot the arm 272 and to consequently pivot the brake member 271 to the position illustrated in FIG. 22, and thus moving the brake shoe 274 out of braking cooperation with the composite web 203. In the position as shown in FIG. 22, the spring 275 exerts a force along centerline 282 which is now on the other side of the axis of the stud 273'. The arm 272 and the brake member 271 remain in the position shown in FIG. 22 until such time as the print head moves far enough away from the platen 174 toward its retracted position to enable the abutment 280 to contact the arm 272. When the abutment 280 contacts the arm 272, the arm 272 and the brake member 271 are pivoted so that the spring force is again exerted along centerline 279, thereby causing the arm 272 and the brake member 271 to remain in the position shown in FIG. 23, until the next cycle, when the print head 170 again moves toward the platen 174 and the arm 272 is contacted by the abutment 281.

Due to the overcenter arrangement, the arm 272 and the brake member 271 remain in the position shown in FIG. 22 until almost the very end of the movement of the print head 170 to its retracted position (FIG. 23). During the retracting movement of the print head 170, the pawl 265 drives the ratchet wheel 252 and the feed wheel 171 to advance the composite web 203. The brake 270 is effective substantially simultaneously with the completion of feeding of the web 203.

With reference to FIG. 22 initially, the brake mechanism 270 is also shown to include a brake member 283 which has a brake shoe 284 composed of a flexible resilient material. During use of the apparatus, the brake member 283 is stationary in the position shown in FIG. 22. However, during loading of the composite web 203, the brake member 283 can be moved manually to its ineffective position shown in FIG. 21. The brake member 283 is integrally joined by a hub 285 to a slotted arm 286. The hub 285 is pivotally mounted on the post 178. The arm 286 has an elongated slot 287. A slide 288 has an elongated slot 289 which receives the post 178 and a pin 290 secured to the arm to provide a pin-and-slot connection. The slide 288 has a finger-engageable projection 288' by which the slide 288 can be moved between the position shown in FIG. 22 and the position shown in FIG. 21. As the slide 288 moves from the position shown in FIG. 22 to the position shown in FIG. 21, the pin 290 cooperates with the slot 287 to pivot the arm 286 and the brake member 283 counterclockwise so that the brake member 283 is in its ineffective position shown in FIG. 21. A shaft 291 extends through a bore 292 in the slide 288. Because of the position of the axis of the shaft 291 as viewed in FIG. 21, in which the arm 286 is counterclockwise of the position shown in FIG. 22, the brake member 283 is in its ineffective position. When the shaft 291 has moved to the position shown in FIGS. 22 and 23, the arm 286 has moved clockwise and hence the brake member 283 is in its effective position. With reference to FIG. 23, due to the inclination of the brake member 271 and the location of the brake shoe 274 relative to the brake shoe 284 the brake 270 is self-energizing. Thus, when a label 207 is being applied, the tug that the label exerts on the web 203 upstream of the delaminator 175 causes the brake 270 to exert an even greater braking force on the web 203.

The shaft 291 mounts a roll generally indicated at 293 comprised of a roll member 294 on one side of the slide 288 and a roll member 295 on the other side of the slide 288. The shaft 291 also passes through an elongated arcuate slot 296 of an arm 297 which is pivotally connected to a pin 298 (FIGS. 8, 17 and 21) of the gear 172. A washer 299 (FIG. 8) is disposed on the shaft 291 between the roll member 294 and the arm 297 and a retractable guide 300 is disposed on the shaft 291 between the roll member 295 and a retainer 301 secured to the marginal end of the shaft 291. Guide section 312 has an integral pin 300' received in an elongated slot 300" in the guide 300. In the position shown in FIG. 10 in which the guide 300 is shown in its retracted solid line position, the guide 300 is out of guiding relationship with respect to the side edge of the composite web 203. In the position shown in phantom lines 300PL in FIG. 10, the guide 300 is in its effective guiding position.

The shaft 291 is secured to an arm 302 (FIGS. 21 through 23) pivotally mounted on a stud 303 carried by the frame plate 155. A tension spring 304 is connected at its one end to a tab 305 formed integrally with the arm 302 and at its other end to a pin 306 secured to the frame plate 155. In the position shown in FIG. 22, the roll 293 is in cooperation with the feed wheel 171 and the arm 302 is in its most clockwise position. In this position of the arm 302, the spring 304 exerts a force along centerline 307 on one side of axis 308 of the stud 303 tending to urge the arm 302 and the roll 293 which it carries into their most clockwise positions best shown in FIG. 22. In FIG. 21, the arm 302 and the roll 293 are in their most counterclockwise positions and the spring 304 exerts a force along centerline 309 on the other side of the axis 308 to hold the arm 302 and the roll 293 in the position shown.

With reference to FIG. 10, it is apparent that the user can shift the slide 288 into the position shown by exerting a force to the left on the projection 288'. Not only are the roll 293, the guide 300, the arm 302 which it carries, the associated arm 286, and the brake member 283 moved to the position shown in FIG. 10 and hence the roll 293, the guide 300, and the brake 270 are deactivated, but the spring 304 (FIG. 21) holds these components in that position for easy loading of the apparatus 150. It is noted in FIG. 10, that the shaft 291 is at one end of the slot 296 in the arm 297. Assuming the apparatus has been threaded with the label supply, upon the first actuation of the actuator 222, the sum 297 acting on the shaft 291 will cause the arm 302 to be pivoted counterclockwise (FIG. 10) so that the roll 293 is returned to cooperation with the supporting material web 203 and the feed wheel 171, so that the guide 300 is moved into guiding cooperation with the side edge of the web 203, and so that the brake member 283 is moved to its effective position as shown in FIG. 23. Subsequent operation of the actuator 222 will cause the arm 297 to move relative to the shaft 291 but because of the slot 296 the arm 297 will have no effect on the shaft 291. Optionally, the slide 288 and the operatively associated components can be returned from the position shown in FIGS. 10 and 21 to the position shown in FIG. 23 by pushing the projection 288' to the right as viewed in FIG. 10.

From the place where the composite web 203 is paid out of the roll, it passes over and in contact with a resilient device 310 in the form of a curved leaf spring. The resilient device 310 deflects when the feed wheel 171 is advancing the composite web 203 and after the brake 270 is applied the device 310 gradually returns as additional web 203 is caused to be paid out of the supply roll. Track structure generally indicated at 311 includes guide track sections 312, 313 and 314. The track section 312 has a forked end 315 which is received by marginal end 316 of an extension 318 of the platen 174. The track section 312 has a short tubular portion 319 which is received by the post 179. Accordingly, the track section 312 is securely held in position relative to the frame plate 155 by the marginal end 215 and by the post 179. After passing in contact with the resilient device 310, the composite web 203 enters a first zone Z1 above the track structure 312 and below the print head 170. The print head 170 carries a roll 320 comprised of a plurality of for example, three rollers 321 rotatably mounted on a shaft 322 mounted on the print head 170. The rollers 321 deflect the composite web 203 into contact with the track section 312 as the print head 170 moves between its retracted position shown in solid lines in FIG. 10 and the printing position shown in phantom lines in FIG. 10. The roll 320 reduces to a minimum the frictional force which would otherwise exist if the composite web 203 would be rubbed by the print head 170. In that there are a plurality of rollers 321 there is no tendency to bind on the shaft 322 as if only one long roll (not shown) were provided. From the zone Z1 the composite web 203 passes partly around a roll generally indicated at 323 which is comprised of a plurality, for example three, rollers 177. The rollers 177 can rotate freely on the post 176. In that a plurality of rollers 177 are provided, there is no tendency of these rollers 177 to bind on the post 176 as if only one long roll (not shown) were provided. After the composite web 203 passes around the roll 323, a label 207 of the composite web 203 is disposed between the platen 174 and the print head 170. FIG. 10 shows one of the labels 207 as being almost entirely delaminated from the supporting material web 205 and ready to be applied by applicator 173. The applicator 173 is shown to comprise a roll rotatably mounted on a post 325 secured to the frame plate 155, although other types of applicators can be used instead if desired. A removable retainer 326 maintains the applicator 173 on the post 325. In the loading position shown in FIG. 10, the composite web 203 passes partly around an end of the slide 288 and partly around the roll 293 and from there partly around the feed wheel 171. The shaft 178 carries a roller 327 (FIG. 8) between the hub 285 and the frame plate 155 and a roller 328 disposed between the slide 288 and a retainer 329. When the slide 288 is in the position shown in FIG. 22, for example, the web 205 is in sliding contact with the end of the slide 288 and in rolling contact with the rollers 327 and 328.

The track section 313 cooperates with the track section 314 to provide a discharge chute at a zone Z2 through which the supporting material web 205 exits. The track section 313 has a pair of spaced-apart tubular portions 330 and 331 received respectively by posts 179 and 180. The track section 313 has an integrally formed curved retaining bracket 332 which passes partly around a flange 333 of a post 334. Thus, the track section 313 is secured to the frame plate 155 and to the housing section 152. The track section 313 includes a channel-shaped portion 335 to which the connector 332 is joined. The track section 314 has an offset flange 336 which fits into the channel-shaped portion 335 to interlock the track section 314 with the track section 313. The track section 314 also has a curved retaining bracket 337 which extends partly around the flange 333 and has a pair of spaced-apart offset flanges 338 and 339 which fit against the outside of the channel-shaped portion 335. A tubular portion 330' secures one end of the track section 314 to the frameplate and the flanges 336, 338 and 339 interlock the track sections 313 and 314. The tubular portion 319 is received by the post 179 between the tubular portion 330 and 330'. The track structure 311 also includes a stripper 340 which engages the smooth annular outer surface 171a of the feed wheel 171. The stripper 340 is provided with a pair of offset flanges 341 and 342 which fit respectively into grooves 343 and 344 in the track section 313. The post 179 is longer than the combined lengths of the tubular portions 319, 330 and 330' and thus a projection 345 formed integrally with the stripper 340 can fit snugly into the end of the tubular portion 331.

As best shown in FIG. 26, the resilient device 310 has a marginal end 346 having a pair of holes 347. A connector 348 includes a plate section 349, a pair of upstanding aligned members 350 which lie in one plane, and a member 351 which lies in a plane parallel to the plane 350. Each member 350 includes a tapered stud 352. The device 310 can be assembled onto the connector 348 by passing the marginal portion 346 between the members 350 and 351 until the studs 352 are recieved in the holes 347; the marginal end 346 flexes slightly to allow this to happen. The member 351 retains the spring device 310 in the assembled position relative to the connector. The connector 348 is received in an undercut recess 353 in the track section 312 as shown in FIG. 10. The housing is shown to have an opening 354 (FIG. 10) having relatively sharp external edges 355 and 356 which can serve as cutting edges for removing the excess web 205. The knife 355 can cut the web 205 by drawing the web 205 upwardly and the knife 356 can cut the web by pulling the web downwardly.

The housing section 153 mounts a lock generally indicated at 357 best shown in FIGS. 24 and 25. The lock 357 includes a slide member 358 received in an elongated pocket 359 in the housing section 153. The slide 358 includes a manually engageable projection 360 for moving the slide 357 against the force of a compression spring 361. The spring 361 bears against a flange 362 and the end of the slot 363. The slide 358 includes a pair of spaced apart generally parallel flexible resilient arms 364 having respective projections 365 and tapered faces 366. In assembling the slide 358 onto the housing section 153, the slide is manually pressed into the slot 363; this causes the arms 364 to yield resiliently and to return once their projections 365 are against the inside of the housing section 153 as shown in FIG. 25. A block 367 disposed between and spaced from the arms 364 has a blind hole 368 for receiving the other end portion of the spring 361. In its assembled condition, the spring 361 urges on the block 367 toward end 369 of the slot 363. When the housing section 153 is in the position to be locked, a curved tip or retaining edge 370 of the block 367 is received in an annular recess 371 in the post 179, thereby locking the section 153 in place. To unlock the lock 357 and remove the housing section 153, the projection 360 is pushed generally to the left as viewed in FIG. 24, thereby moving the tip 370 out of the recess 371 and compressing the spring 361, and thereupon the section 153 can be unsnapped from the remainder of the housing. When it is desired to replace the housing section 153, the housing section 153 is positioned so that the flanges 164 (FIG. 8) are behind the flange 165 and then the housing section 153 is simply snapped into its final locked position. In so doing, the members 166 snap into recesses 167 and the lock 357 lock automatically. This automatic locking of the lock 357 is feasible because of the cam face 372 on the block 367 which cooperates with a chamfered or cam face 373 on the post 179. As the housing section 153 is pushed into place the cam face 372 cooperates with the cam face 373 to cause the slide 358 to be moved generally to the left (FIG. 24) away from end 369 of the slot 363. When the housing section 153 is snapped into place, the tip 370 moves into alignment with the recess 371, and this allows the entire slide 358 to move generally to the right (FIG. 24) to cause the tip 370 to be received in the recess 371, thereby locking the housing section 153 in place.

It is conducive to smooth operation of the gear section 227 and the gear section 229 of the gear 172 to have precise meshing engagement in spite of manufacturing variations. This is especially true in that the gear 172 is mounted by a support 236 secured to the frame plate 155 and the actuator 222 is mounted in the handle 159 of the housing 153 at a considerable distance from the axis of the support 236. The eccentric 224 has an outer circular cylindrical surface and an eccentric internal bore 376. The pin 223 is received in the bore 376. The housing section 154 has a boss 379. A hole generally indicated at 380 extends through the housing section 154 and its boss 379. The hole is stepped so as to provide a shoulder 381. A self-tapping screw 382 passes through the hole 380 and is threadably received in an elongated hole 223' in the pin 223. As the screw 382 is tightened, the end of the pin 223 is drawn against the shoulder 381 by the head of the screw 382. The housing section 160 has a boss 383 with a great number of ridges 384 and grooves 385 as best shown in FIG. 13. The eccentric 224 has external ridges 386 and grooves 387 arranged concentrically with respect to the eccentric hole 223'. A hole generally indicated at 388 extends through the housing section 160 and its boss 383. The hole 388 is of reduced diameter at a shoulder 389. A self-tapping screw 390 bears against the shoulder 389 and is threaded into the hole 223' in the sleeve 223. It is apparent that by loosening the screw 382 and removing the housing section 154 and by shifting the eccentric 224 on the sleeve 223 so that the ridges 386 and grooves 387 loose contact with the respective grooves 385 and ridges 384, the eccentric 224 can be manually rotated relative to the housing section 160 on the sleeve 223 until the eccentric 224 is at the selected position and then the eccentric 224 can be shifted back into the hole 388 so that its ridges 386 and grooves 387 are again in locking engagement with respective grooves 385 and ridges 384. In this manner the meshing engagement of the gear sections 227 and 229 can be initially precisely adjusted and maintained in adjustment during use. As an aid to rotating the eccentric 224 while making the adjustment, the eccentric 224 is provided with a knurled section 391 which can be easily gripped by the assembler's fingers.

With reference to FIG. 27 there is shown the delaminator 175. The delaminator comprises an injection molded one-piece support 392 having a pair of forked end sections 393, a plate-like retainer portion 394, and a channel-shaped end portion 395. The forked portions 393 are received in respective cutouts 396 of the platen 174 and the channel-shaped portion 395 is received under a marginal end 297 of the platen 172. The portion 394 is flexible and resilient so as to enable a projection 398 to snap into a hole 398' in the platen 174 as shown in FIG. 10. The hole 298' is disposed so that between the places where the printing bands 201 contact the platen 174 so that the hole 398' will not interfere with the printing function. A plurality of small diameter rollers 400, for example, seven in number, are rotatably mounted on a rod 399. It is preferred that the diameter of the rollers 400 be as small as possible so that the supporting material web 205 is caused to undergo a very sharp change in direction. By way of example, not limitation, the outer diameter of the rollers 400 is about 0.08 inch, the inside diameter is about 0.05 inch, and the length is about 0.150 inch. The outside diameter of the shaft 39 is about 0.04 inch. There are a plurality of relatively small rollers 400 in that the rollers 400 rotate considerably more freely than would a roll having a combined length of all the rollers 400.

With reference to FIG. 11, ink roll 401 is shown to be rotatably mounted on a post 401' secured to an arm 402. The arm 402 is pivotally mounted on a post 403 secured to the frame plate 155. A tension spring 404 is connected at one end to an upstanding tab 405 on the arm 402 and its other end to a post 406 mounted on the frame plate 155. The arm 402 and the ink roll 173 are shown in one extreme position by solid lines in which the print head is in its retracted position and by phantom lines in which the print head 170 is in its extended or printing position. The shaft 401' extends through an arcuate slot 407 in the frame plate 155. With reference to FIG. 28, the ink roll 401 is shown to comprise a hub generally indicated at 408. The hub 408 is shown to include a pair of hub portions 409 and 410 having respective bores 411 and 412 aligned with respect to each other. The shaft 401' is shown to be received in the bores 411 and 412. The hub portion 409 has a reduced-diameter, continuous, annular projection 413 received in a continuous annular socket 414. The projection 413 has a continuous annular external groove 415 and the hub portion 410 has a continuous annular internal bead or projection 416. The groove 415 is shallow and the mating bead 416 is relatively small so that the projection 413 can be snap-fitted into the socket 414 as the flexible resilient material of which the hub portions 409 and 410 is composed yields. It is a feature of the invention that the head 416 in the socket 414 provides an ink-tight seal so that ink contained in a porous roll 417 received about the hub 408 cannot seep into the bores 411 and 412 to cake or gum up which would interfere with the free rotation of the ink roll 401 on the shaft 401'. The hub portions 409 and 410 have respective annular outwardly extending flanges 418. The flanges 418 bear against bearing surfaces 419 at each side of the print head 170. The groove 415 and the mating bead 416 obviate the need for a separate seal member (not shown). A washer 420 is received by the shaft 401' between the hub section 410 and the frame plate 155. Hub section 409 has an integrally formed flexible resilient finger or projection 421 shown to be received in a continuous annular groove 422 near the free end of the shaft 401'. As the ink roll 173 is inserted onto the shaft 401', the finger 421 yields and then is received in the groove 422 to removably hold the roll 401 on the shaft 401'. The hub portion 409 also has an extension 423 and an obstruction 424 in the form of a ridge which extends into alignment with the bores 411 and 412. The obstruction 424 prevents the ink roll 401 from being inserted onto the shaft 401' in the wrong direction in which event the resilient finger 421 would not be able to cooperate with the groove 422 and the ink roll 173 might shift off the shaft 401'.

Referring to FIG. 9 there is shown the composite web 203 which constitutes an improvement over U.S. Pat. No. 3,783,083. Groups 425 of bar cuts or slits are provided at longitudinally spaced-apart intervals along the length of the composite web 203. Although there are shown to be two spaced-apart groups 425 of cuts disposed between the butt-cuts 206 which define the end edges of each label 207, one or more than two groups 425 can be provided in each label 207, and although the groups 425 are shown to be generally centrally located between the end edges of the respective labels 207, the group 425 can be at other locations. Each group 425 of cuts is shown to be in a generally T-shaped configuration and to comprise a transversely aligned pair of bar cuts or slits 426L in and preferably through the label material 204 and a transversely aligned pair of bar cuts or slits 426S in the supporting material 205. The respective pairs of cuts 426L and 426S are separated by respective lands 427L and 427S. Longitudinally extending bar cuts or slits 428L and 428S are shown to extend in and preferably through the label material 204 and through supporting material 205 respectively to the respective lands 428L and 428S. There are also two longitudinally extending bar cuts or slits 429 which extend in and preferably through the label material 204 across each of the butt-cuts 206 into the marginal ends of the labels 207. The cuts 429 however extend only through the label material 204. The two cuts 426S and the cut 428S of a group are aligned with respective two cuts 426L and the cut 428L of the group. When the teeth 237 of the feed wheel 171 engage the supporting material 205 at the cuts 428S, the portion of the web between the adjacent ends of both cuts 426S and the cut 428S tears or ruptures to form a hole in the supporting material web 205. A tooth 237 is preferably almost as wide as the combined length of adjacent cuts 426S and the intervening land 427S so that a substantial portion of the length of each cut 426S provides a drive face.

In order to load the apparatus 150, the housing section 153 is first removed by moving the projection 360 generally to the right (FIG. 8). Next the projection 288' is moved generally to the left as viewed in FIG. 10 to cause brake member 283, roll 293 and guide 300 to move to their ineffective positions. If there is a spent core 208 on the reel 209, then the core 208 is removed manually and a new supply roll is pushed onto the hub 213. The leading end of the composite web 203 is passed over the resilient device 310 and pushed into the zone Z1 as best shown in FIG. 10. From there the web 203 is passed around roll 323 and around the delaminator 175, and from there the web 203 is passed around the end of the slide 288 and under the roll 293. From there the web 203 is passed partly around the feed wheel 171 and through the zone Z2. The entire threading of the composite web 203 just described can be accomplished without removing any of the labels 207 from the supporting material web 205. Now the print head 170 can be set to print the selected indicia on the label 207 which is registered with the platen 174. Upon the first actuation of the actuator 222, the gear 172 causes the arm 297 to pull slide 288 to the right as viewed in FIG. 10, thereby causing the roll 293 to move into cooperation with the web 203 and the feed wheel 171, to cause the brake member 283 to move into its effective position as shown in FIG. 23, and to cause the guide 300 to move to its effective position shown by phantom lines 300PL. In that the first actuation of the actuator 222 from its initial position drives the gear 172 to in turn drive the print head 170 into printing cooperation with the platen 174, the label 207 at the printing position or zone will be printed. When the print head 170 is in printing cooperation with the platen 174, the drive end 269 of the pawl 265 has moved into position adjacent the next successive tooth 253 of the ratchet wheel 252. Upon release of the actuator 222, the spring 226 of the assembly 225 will cause the actuator 222 to pivot counterclockwise (FIG. 10) thereby causing the gear 172 and the pawl 265 to move clockwise. This movement of the pawl 265 causes the feed wheel 171 to rotate clockwise. In that the feed wheel 171 and the roll 293 are in cooperation the teeth 237 will break through the portion of the supporting material 235 between the ends of the bar-cut 428S and the adjacent ends of the bar-cuts 426. The teeth 171' engage the drive faces formed by the bar-cuts 426S to advance the web 203 when the feed wheel 171 is rotated. The cycle operation is complete when the actuator 222 has returned to its initial position. During continued operation of the apparatus 150, labels 207 are successively delaminated from the supporting material web 205. It is apparent that upon each actuation and release of the actuator 222, the print head 170 is first moved into printing cooperation with a label 207 and thereafter that label is advanced to a position shown in FIG. 10 in which the leading label 207 is shown almost entirely delaminated from the supporting material web 205. The leading label 207 is thus lightly adhered to the web 205 at its trailing end until it is applied to an article.

Referring to FIGS. 8 and 33, a rewinder 440 is shown to include a unitary body 441 having a generally annular portion 442 defining a compartment 443. The body 441 has an inlet portion or inlet 444 with an inlet slit or narrow slot 445. The annular portion 442 is open at its one side as shown and has a side wall 446 closing off its other side. The inlet 444 has a connector 447 including a pair of notches 448 and 449 adjacent flanges 450 and 451. The rewinder 440 is removably connected to the apparatus 150 by sliding the connector 447 through the open end of the opening 354. As the supporting material web 205 passes through zone Z2 it enters the inlet slot 445 and winds into a roll as shown in FIG. 33. The inside of the annular portion 442 is provided with a scalloped configuration defined by ridges 335 and intervening grooves 336. As the web 205 contacts only the ridges 335 there is very little friction between the portion of the web 205 and the ridges 335. In addition, the inside of the compartment 443 can be coated with a suitable lubricant such as silicone. Viewing both FIGS. 10 and 33, it is noted that the web 205 is wound up in the rewinder 440 in the same direction of curl of the web 205 caused by the web 205 being wound on the roll R. This facilitates rewinding. The end of the inlet slot 445 terminates at a cutting edge or knife 457 by which the portion of the web 205 in the compartment 443 can be severed from the remainder of the web 205 simply by reaching into the open side of the compartment 443 and pulling the web 205 against the knife 457.

In the embodiment of FIGS. 34 and 35, a rewinder 460 is shown to include a unitary body 461 having a generally annular portion 462 defining a compartment 463. The body 461 has an inlet portion or inlet 464 with an inlet slit or narrow slot 445. The annular portion 462 has a side wall 466 closing off one side. The inlet 464 has a connector 467 identical to the connector 447. The inside of the annular portion 462 is provided with a scalloped configuration like that of the rewinder embodiment of FIGS. 8 and 33. The inlet 464 terminates at a cutting edge or knife 477. A shaft 478 is formed integrally with the wall 466 and rotatably mounts a spool or reel 479. The reel 479 includes a hub 480 integrally joined to a disc 481. A compression spring 482 received about the shaft 478 bears against the side wall 466 and a shoulder 483 inside the hub 480. A shaft 484, snap-fitted into spaced-apart holders 485, is joined to an annular portion 486. The annular portion 486 seats a flexible resilient O-ring or other suitable frictional drive member 487. The drive member 487 is in frictional contact with the disc 481 and the disc 210. The drive member 487 contacts a radiused annular portion 488 of the disc 481 and the surface of disc 210. The holders 485 have respective annular portions 489 which extend through slightly more than 180° so that the shaft 484 can be snapped into the annular portions 489 or removed therefrom if desired. A compression spring 490 received about the shaft 484 exerts a force on one of the holders 485 and the annular portion 486. The force exerted by the spring 490 is greater than the force exerted by the spring 482 so the drive member 487 is always urged into contact with the disc 210 and the drive member 487 is always urged into contact with the disc 481.

A finger 491 is formed integrally with the disc 481 and extends generally parallel to the hub 480. Marginal end 205' of the supporting material web 205 is received between the hub 480 and the finger 491. The annular portion 486 and the drive member 487 constitutes an idler or idler wheel generally indicated at 492. It is apparent that the reel 209 is drivingly coupled to the reel 479. As the apparatus 150 is operated the disc 210 turns, thereby driving the idler wheel 492 which in turn drives the reel 479. The purpose of the idler wheel 492 is to cause the reel 479 to rotate in the direction of the natural curl of the web 205 on the roll R. In the illustrated embodiment the reel 479 turns in the same direction as the reel 209.

By way of example, not limitation, the apparatus of the disclosed embodiments is constructed mainly of molded plastics material. The frame plate 55 is preferably composed of steel. The actuator 81, the gear 66 and lever 67, the ratchet and feed wheels 65 and 64, a substantial portion of the print head 63, frame sections 52, 53 and 54, the hub 113, and tracks 94 and 95 are composed of a suitable molded plastics material. With reference to FIG. 7, link 131 and lever 133 are also composed of plastics material. In the embodiment of FIGS. 8 and 10 through 36, all the components are composed of molded plastics material, except the frame plate 155 and the platen 174 which are preferably composed of a rigid metal such as steel, the metal posts 325, 176, 178, 179, 180, 181, 291, 273 and 401, the metal support 236, the steel rod or shaft 399, the steel springs 187, 304, 361, 404, 226, 482 and 496, the spring steel resilient device 310, the steel arms 297 and 402, the spring steel clamp 268, the spring steel retainers 301, 326, 329, the flexible resilient applicator 173 and the frictional member 487 composed of rubber, the ball bearing strips 197 and 198, the porous ink roll 417 composed of a suitable, porous, rubber, vinyl or rubber-modified plastics material, and fasteners 199, 200, 161, 382 and 390. A small number of components of the print head 174 are also constructed of metal.

The hand-held apparatus 150 of the embodiment of FIGS. 8 and 10 through 36 is rugged in construction but is also light weight so that it can be used for extended period of time, namely the apparatus weighs about 1.6 pounds without a label supply roll and without the rewinder 440 or 460. The rewinder 440 weighs about 0.08 pounds. In any event the apparatus of the various embodiments of the invention is of the type that weighs less than about 3 pounds and this distinguishes it from bulky or stationary apparatus which are not practical to be hand held and operated. It is, however, readily apparent that many of the features of the invention can also be used in stationary type apparatus. Moreover, it is apparent that certain of the features of the invention are also applicable to apparatus that imprints and dispenses labels, tags or the like but that does not apply them and that other features of the invention are also applicable to apparatus that applies labels but which does not print them.

Other embodiments and modifications of this invention will suggest themselves to those skilled in the art, and all such of these as come within the spirit of this invention are included within its scope as best defined by the appended claims.

I claim:

1. Apparatus for printing and applying pressure sensitive labels carried on a web of supporting material, comprising: a frame, a platen, a print head movably mounted by the frame into and out of printing cooperation with the platen, a delaminator for delaminating printed labels from the supporting material web, an applicator for applying printed labels, a feed wheel having teeth for advancing the web and effecting label delamination at the delaminator, and means for moving the print head into printing cooperation with the platen and for thereafter moving the feed wheel for advancing the web, the moving means including ratchet teeth coupled to the feed wheel and a pawl for engaging the ratchet teeth, the moving means further including a first lever, a first pivot for pivotally mounting the lever to the frame, a second lever for effecting movement of the print head, a second pivot for pivotally mounting the second lever, a link, a third pivot for pivotally connecting the first lever and the link, a fourth pivot for pivotally connecting the link and the second lever so that pivotal rotation of the first lever in one direction causes pivotal rotation of the second lever in the opposite direction to effect movement of the print head into cooperation with the platen, and return spring means for returning the first and second levers, the link and the print head to their initial positions and for causing the pawl to drive the ratchet tooth and advance the feed wheel.

2. Apparatus for printing and applying pressure sensitive labels carried on a web of supporting material, comprising: a frame, a platen, a print head movably mounted by the frame into and out of printing cooperation with the platen, a delaminator for delaminating printed labels from the supporting material web, an applicator for applying printed labels, a feed wheel having teeth for advancing the web and effecting label delamination at the delaminator, and means for moving the print head into printing cooperation with the platen and for thereafter moving the feed wheel for advancing the web, the moving means including ratchet teeth coupled to the feed wheel and a pawl for engaging the ratchet teeth, the moving means further including a first lever, a first pivot for pivotally mounting the lever to the frame, a second lever for effecting movement of the print head, the ratchet teeth being disposed coaxially with the feed wheel and one of the levers, a second pivot for pivotally mounting the second lever, a link, a third pivot for pivotally connecting the first lever and the link, a fourth pivot for pivotally connecting the link and the second lever so that pivot rotation of the first lever in one direction causes pivotal rotation of the second lever in the opposite direction to effect movement of the print head into cooperation with the platen, and return spring means for returning the first and second levers, the link and the print head to their initial positions and for causing the pawl to drive the ratchet tooth and advance the feed wheel.

3. Apparatus for printing and applying pressure sensitive labels carried on a web of supporting material, comprising: a frame, a platen, a print head movably mounted by the frame into and out of printing cooperation with the platen, a delaminator for delaminating printed labels from the supporting material web, an applicator for applying printed labels, a feed wheel having teeth for advancing the web and effecting label delamination at the delaminator, and means for moving the print head into printing cooperation with the platen and for thereafter moving the feed wheel for advancing the web, the moving means including ratchet teeth coupled to the feed wheel and a pawl for engaging the ratchet teeth, the moving means further including a first lever, a first pivot for pivotally mounting the lever to the frame, a second lever for effecting movement of the print head, the feed wheel being disposed coaxially with one of the levers, a second pivot for pivotally mounting the second lever, a link, a third pivot for pivotally connecting the first lever and the link, a fourth pivot for pivotally connecting the link and the second lever so that pivotal rotation of the first lever in one direction causes pivotal rotation of the second lever in the opposite direction to effect movement of the print head into cooperation with the platen, and return spring means for returning the first and second levers, the link and the print head to their initial positions and for causing the pawl to drive the ratchet tooth and advance the feed wheel.

4. Apparatus for printing and applying pressure sensitive labels carried on a web of supporting material, comprising: a frame, a platen, a print head movably mounted by the frame into and out of printing cooperation with the platen, a delaminator for delaminating printed labels from the supporting material web, an applicator for applying printed labels, a feed wheel having teeth for advancing the web and effecting label delamination at the delaminator, and means for moving the print head into printing cooperation with the platen and for thereafter moving the feed wheel for advancing the web, the moving means including lever means having a first manually actuated lever, a second lever for moving the print head and a link pivotally connecting the first and second levers so that pivotal rotation of the first lever in one direction causes pivotal rotation of the second lever in the opposite direction to effect movement of the print head into cooperation with the platen, a pawl and ratchet mechanism driven by the lever means for driving the feed wheel, and return spring means for returning the first and second levers, the link and the print head to their initial positions and for causing the pawl and ratchet mechanism to advance the feed wheel.

5. Apparatus for printing and applying pressure sensitive labels carried on a web of supporting material, comprising: a frame, a platen, a print head movably mounted by the frame into and out of printing cooperation with the platen, a delaminator for delaminating printed labels from the supporting material web, an applicator for applying printed labels, a feed wheel having teeth for advancing the web and effecting label delamination at the delaminator, and means for moving the print head into printing cooperation with the platen and for thereafter moving the feed wheel for advancing the web, the moving means including lever means having a first manually actuated lever, a second lever for moving the print head and a link pivotally connecting the first and second levers so that pivotal rotation of the first lever in one direction causes pivotal rotation of the second lever in the opposite direction to effect movement of the print head into cooperation with the platen, a pawl and ratchet mechanism driven by the lever means for driving the feed wheel, the pawl and ratchet mechanism including teeth disposed coaxially with and coupled to the feed wheel, and return spring means for returning the first and second levers, the link and the print head to their initial positions and for causing the pawl and ratchet mechanism to advance the feed wheel.

6. Apparatus for printing and applying pressure sensitive labels carried on a web of supporting material, comprising: a frame, a platen, a print head movably mounted by the frame into and out of printing cooperation with the platen, a delaminator for delaminating printed labels from the supporting material web, an applicator for applying printed labels, a feed wheel having teeth for advancing the web and effecting label delamination at the delaminator, and means for moving the print head into printing cooperation with the platen and for thereafter moving the feed wheel for advancing the web, the moving means including lever means having a first manually actuated lever, a second lever for moving the print head and a link pivotally connecting the first and second levers so that pivotal rotation of the first lever in one direction causes pivotal rotation of the second lever in the opposite direction to effect movement of the print head into cooperation with the platen, a pawl and ratchet mechanism driven by the lever means for driving the feed wheel, the pawl and ratchet mechanism including teeth disposed coaxially with and coupled to the feed wheel, one of the levers being disposed coaxially with respect to the feed wheel.

7. Apparatus for printing and applying pressure sensitive labels carried on a web of supporting material, comprising: a frame, a platen, a print head movably mounted by the frame into and out of printing cooperation with the platen, a delaminator for delaminating printed labels from the supporting material web, an applicator for applying printed labels, a feed wheel having teeth for advancing the web and effecting label delamination at the delaminator, and means for moving the print head into printing cooperation with the platen and for thereafter moving the feed wheel for advancing the web, the moving means including lever means having a first manually actuated lever, a second lever for moving the print head and a link pivotally connecting the first and second levers so that pivotal rotation of the first lever in one direction causes pivotal rotation of the second lever in the opposite direction to effect movement of the print head into cooperation with the platen, a pawl and ratchet mechanism driven by the lever means for driving the feed wheel, one of the levers being disposed coaxially with respect to the feed wheel, and return spring means for returning the first and second levers, the link and the print head to their initial positions and for causing the pawl and ratchet mechanism to advance the feed wheel.

8. Apparatus for printing and applying pressure sensitive labels carried on a web of supporting material, comprising: a frame, a platen, a print head movably mounted by the frame into and out of printing cooperation with the platen, a delaminator for delaminating printed labels from the supporting material web, an applicator for applying printed labels, a feed wheel having teeth engaging the web and effecting label delamination at the delaminator, and means including coacting levers for moving the print head into printing cooperation with the platen and for thereafter moving the feed wheel for advancing the web, the moving means including ratchet teeth coupled to the feed wheel and a pawl for engaging the ratchet teeth, the ratchet teeth being disposed coaxially with respect to the feed wheel, means pivotally mounting one of the levers to the frame coaxially with respect to the feed wheel so that pivotal rotation of one of the levers in one direction causes pivotal rotation of another lever in the opposite direction to effect movement of the print head into cooperation with the platen, and return spring means for returning the levers and the print head to their initial positions and for causing the pawl to drive the ratchet tooth and advance the feed wheel.

9. Apparatus for printing and applying pressure sensitive labels carried on a web of supporting material, comprising: a frame, a platen, a print head movably mounted by the frame into and out of printing cooperation with the platen, a delaminator for delaminating printed labels from the supporting material web, an applicator for applying printed labels, a feed wheel having teeth for advancing the web and effecting label delamination at the delaminator, and means for moving the print head into printing cooperation with the platen and for thereafter moving the feed wheel for advancing the web, the moving means including ratchet teeth coupled to the feed wheel and a pawl for engaging the ratchet teeth, the ratchet teeth being disposed coaxially with respect to the feed wheel, the moving means further including a first lever, a first pivot for pivotally mounting the first lever to the frame, a second lever, a second pivot for pivotally mounting the second lever to the frame, the second lever being pivotally rotated in one direction in response to pivotal rotation of the first lever in the opposite direction to effect movement of the print head into cooperation with the platen, and return spring means for returning the first and second lever and the print head to their initial positions and for causing the pawl to drive the ratchet tooth and advance the feed wheel.

10. Apparatus for printing and applying pressure sensitive labels carried on a web of supporting material, comprising: a frame, a platen, a print head movably mounted by the frame into and out of printing cooperation with the platen, a delaminator for delaminating printed labels from the supporting material web, an applicator for applying printed labels, a feed wheel having teeth for advancing the web and effecting label delamination at the delaminator, and means for moving the print head into printing cooperation with the platen and for thereafter moving the feed wheel for advancing the web, the moving means including ratchet teeth coupled to the feed wheel and a pawl for engaging the ratchet teeth, the moving means further including a first lever, a first pivot for pivotally mounting the first lever to the frame, a second lever, the lever being disposed coaxially with respect to the feed wheel, a second pivot for pivotally mounting the second lever to the frame, the second lever being pivotally rotated in one direction in response to pivotal rotation of the first lever in the opposite direction to effect movement of the print head into cooperation with the platen, and return spring means for returning the first and second levers and the print head to their initial positions and for causing the pawl to drive the ratchet tooth and advance the feed wheel.

11. Apparatus for printing and applying pressure sensitive labels carried on a web of supporting material, comprising: a frame, a platen, a print head movably mounted by the frame into and out of printing cooperation with the platen, a delaminator for delaminating printed labels from the supporting material web, an applicator for applying printed labels, a feed wheel having teeth for advancing the web and effecting label delamination at the delaminator, and means for moving the print head into printing cooperation with the platen and for thereafter moving the feed wheel for advancing the web, the moving means including ratchet teeth coupled to the feed wheel and a pawl for engaging the ratchet teeth, the moving means further including a first lever, a first pivot for pivotally mounting the first lever to the frame, a second lever, the lever being disposed coaxially with respect to the feed wheel and to the ratchet teeth, a second pivot for pivotally mounting the second lever to the frame, the second lever being pivotally rotated in one direction in response to pivotal rotation of the first lever in the opposite direction to effect movement of the print head into cooperation with the platen, and return spring means for returning the first and second levers and the print head to their initial positions and for causing the pawl to drive the ratchet tooth and advance the feed wheel.

12. Apparatus for printing and applying pressure sensitive labels carried on a web of supporting material, comprising: a frame, a platen, a print head movably mounted by the frame into and out of printing cooperation with the platen, a delaminator for delaminating printed labels from the supporting material web, an applicator for applying printed labels, a feed wheel having teeth for advancing the web and effecting label delamination at the delaminator, and means for moving the print head into printing cooperation with the platen and for thereafter moving the feed wheel for advancing the web, the moving means including ratchet teeth coupled to the feed wheel and a pawl for engaging the ratchet teeth, the moving means further including a first lever and a second lever movable in response to movement of the first lever for effecting movement of the print head; a first pivot for pivotally mounting the first lever to the frame; a second pivot for pivotally mounting the second lever; and the ratchet teeth, the feed wheel and one of the levers being disposed coaxially with respect to each other.

* * * * *